United States Patent
Haase et al.

(10) Patent No.: US 9,691,864 B1
(45) Date of Patent: Jun. 27, 2017

(54) SEMICONDUCTOR DEVICE HAVING A CAVITY AND METHOD FOR MANUFACTURING THEREOF

(71) Applicant: Infineon Technologies Americas Corp., El Segundo, CA (US)

(72) Inventors: Robert Haase, San Pedro, CA (US); Timothy Henson, Mount Shasta, CA (US)

(73) Assignee: Infineon Technologies Americas Corp., El Segundo, CA (US)

( * ) Notice: Subject to any disclaimer, the term of this patent is extended or adjusted under 35 U.S.C. 154(b) by 0 days.

(21) Appl. No.: 15/153,764

(22) Filed: May 13, 2016

(51) Int. Cl.
  H01L 29/76  (2006.01)
  H01L 29/40  (2006.01)
  H01L 29/78  (2006.01)
  H01L 29/10  (2006.01)
  H01L 29/66  (2006.01)

(52) U.S. Cl.
  CPC ........ H01L 29/408 (2013.01); H01L 29/1095 (2013.01); H01L 29/401 (2013.01); H01L 29/407 (2013.01); H01L 29/66734 (2013.01); H01L 29/7811 (2013.01); H01L 29/7813 (2013.01)

(58) Field of Classification Search
  CPC .......... H01L 21/76877; H01L 29/7848; H01L 23/142
  See application file for complete search history.

(56) References Cited

U.S. PATENT DOCUMENTS

| 9,006,102 | B2* | 4/2015 | Hong | H01L 21/76898 257/E21.159 |
| 9,230,983 | B1* | 1/2016 | Sharangpani | H01L 27/11524 |
| 9,397,046 | B1* | 7/2016 | Sharangpani | H01L 27/1157 |
| 2007/0284643 | A1* | 12/2007 | Wu | H01L 28/65 257/309 |
| 2009/0224357 | A1* | 9/2009 | Juengling | H01L 29/66545 257/506 |
| 2012/0289046 | A1* | 11/2012 | Ko | H01L 21/32155 438/675 |
| 2013/0248974 | A1* | 9/2013 | Alsmeier | G11C 16/04 257/321 |
| 2015/0163915 | A1* | 6/2015 | Kautzsch | H05K 1/0284 361/761 |

FOREIGN PATENT DOCUMENTS

| DE | 10014660 A1 | 10/2001 |
| DE | 102013103099 A1 | 9/2013 |
| DE | 102013108614 A1 | 2/2014 |

* cited by examiner

*Primary Examiner* — Thao P Le
(74) *Attorney, Agent, or Firm* — Murphy, Bilak & Homiller, PLLC

(57) ABSTRACT

A method for manufacturing a semiconductor device includes: providing a semiconductor substrate; forming at least one recess in the semiconductor substrate; the recess having a bottom and a sidewall; forming an auxiliary structure on the sidewall and the bottom of the recess and forming a hollow space within the recess; filling the hollow space of the recess with a filling material for forming a filling structure in the recess; removing portions of the auxiliary structure from the sidewall of the recess so as to form at least one cavity between the filling structure and the sidewall of the recess; and sealing the cavity at the first side of the semiconductor substrate.

15 Claims, 19 Drawing Sheets

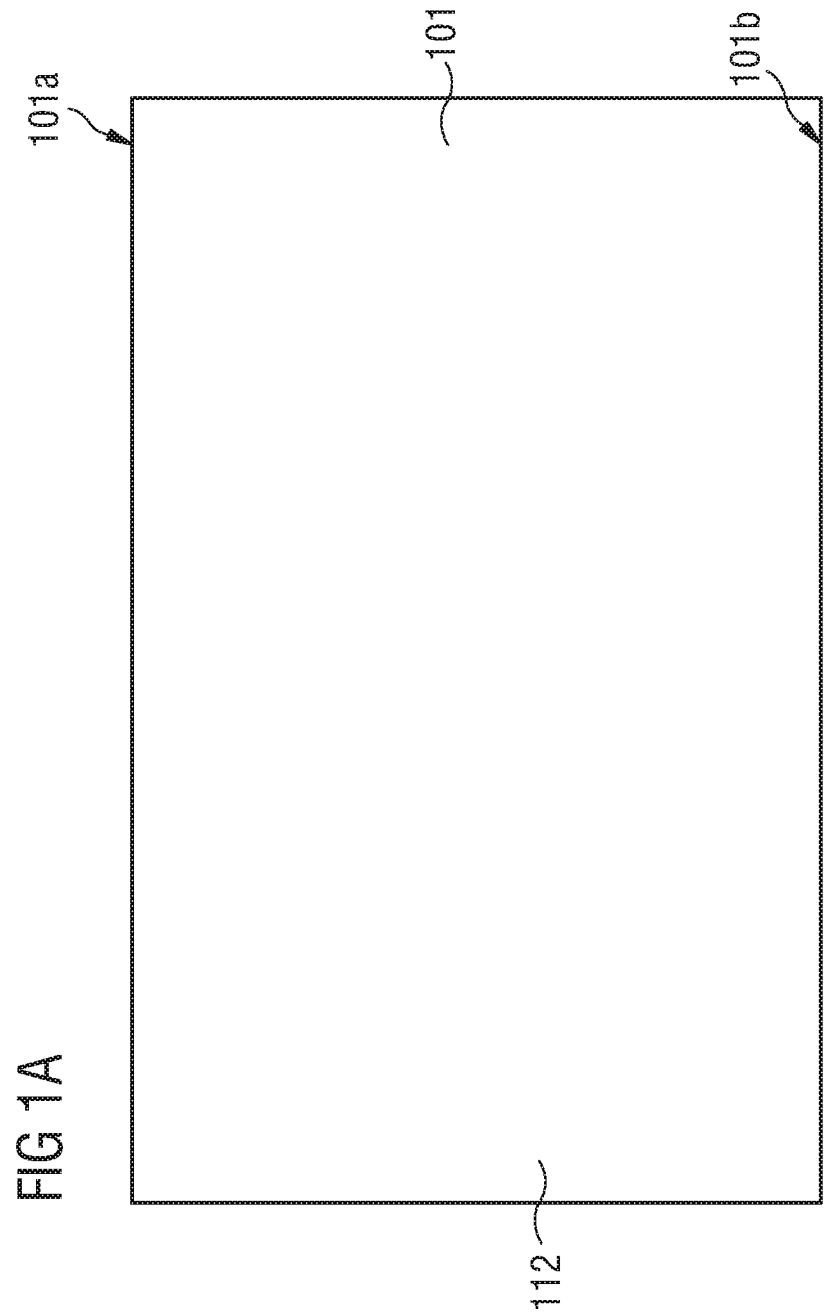

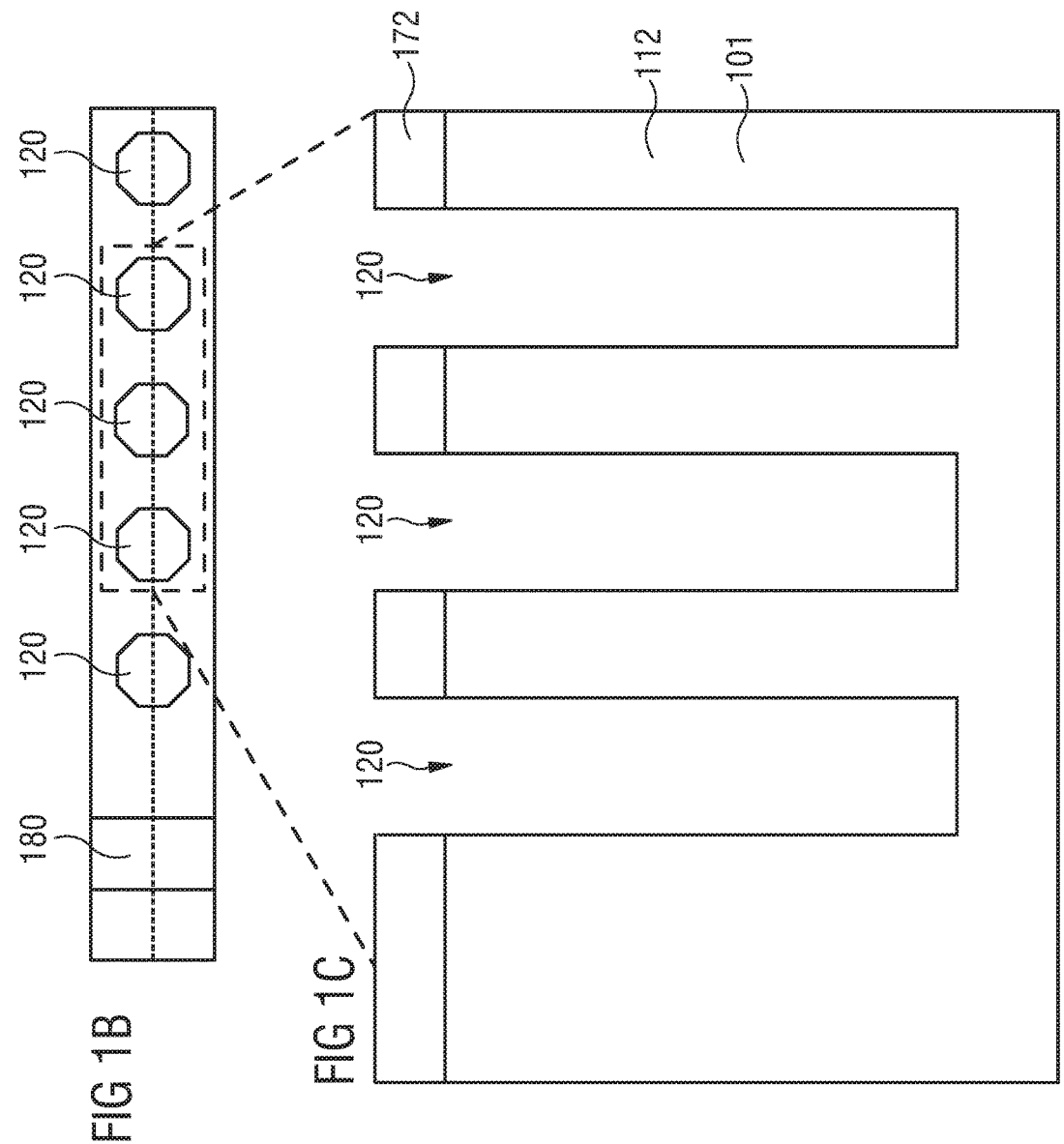

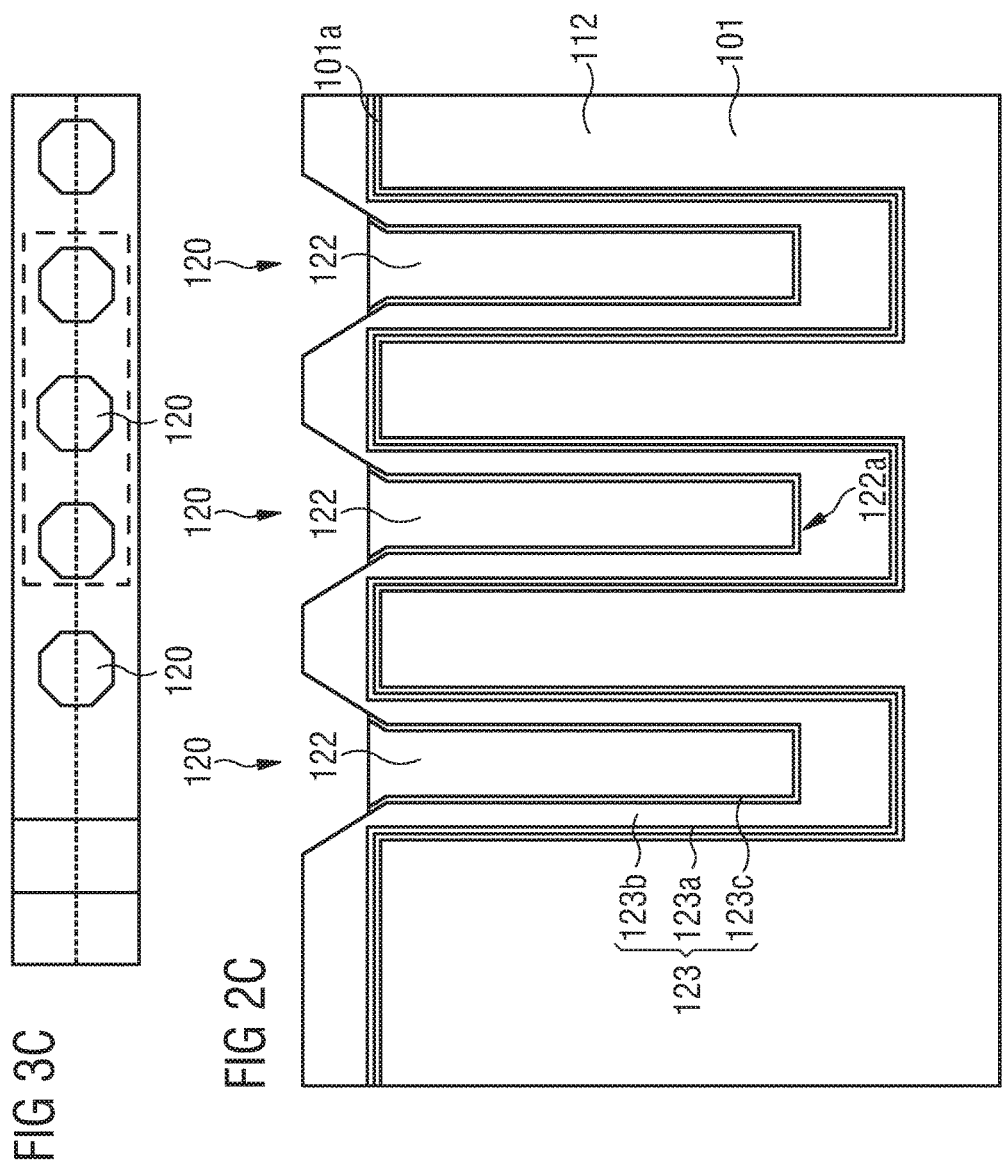

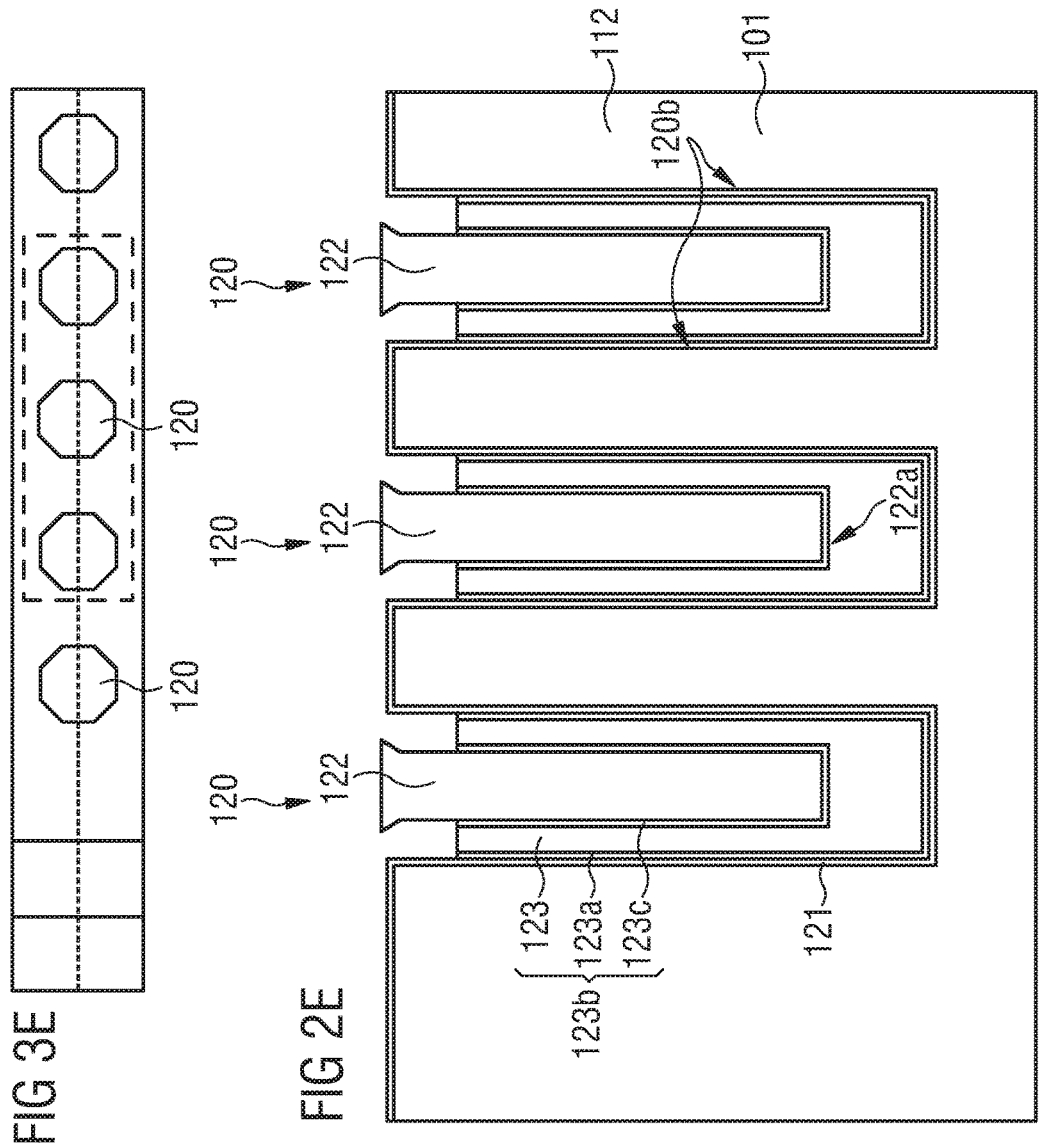

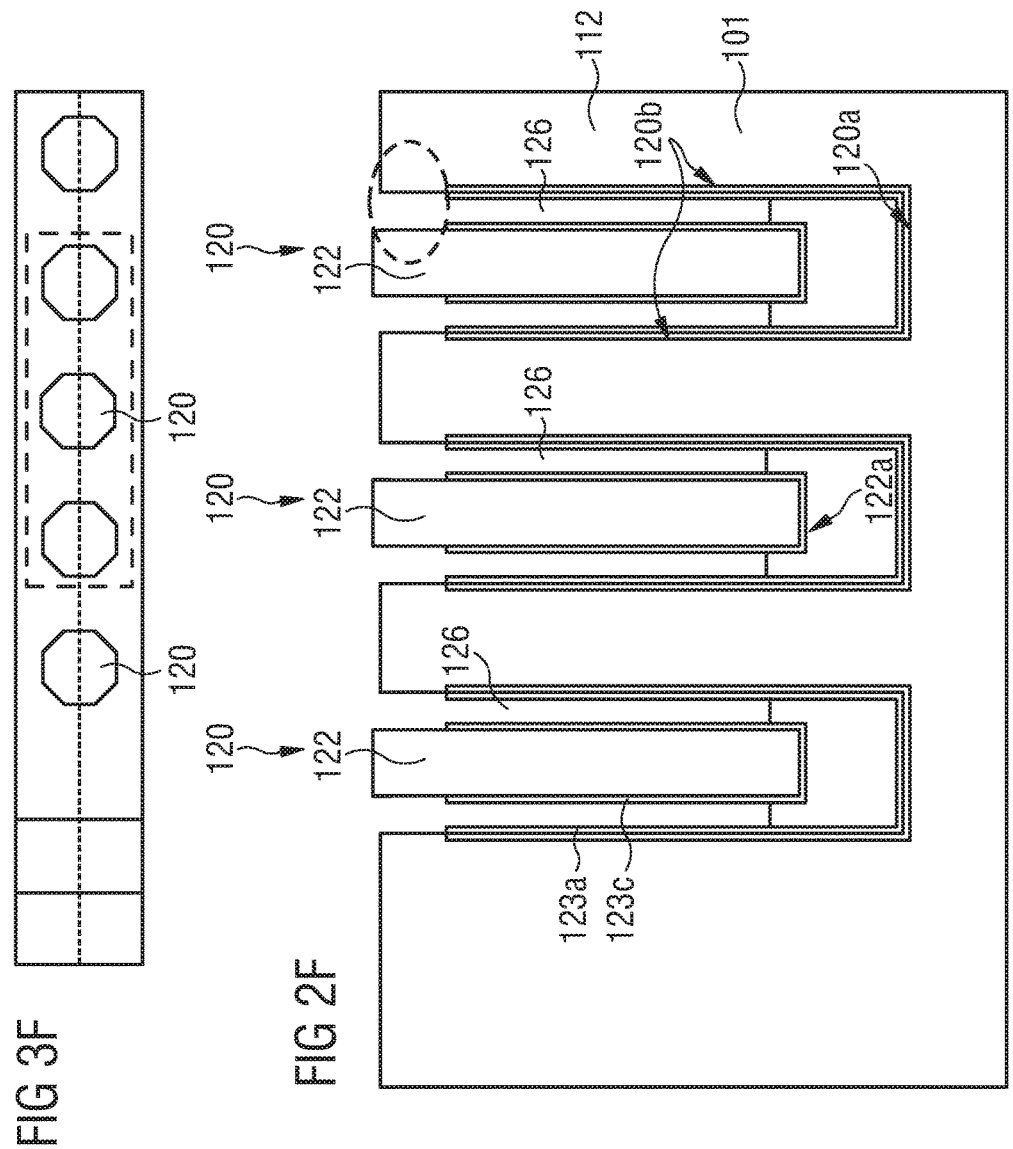

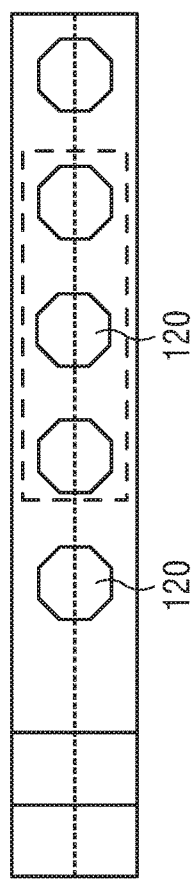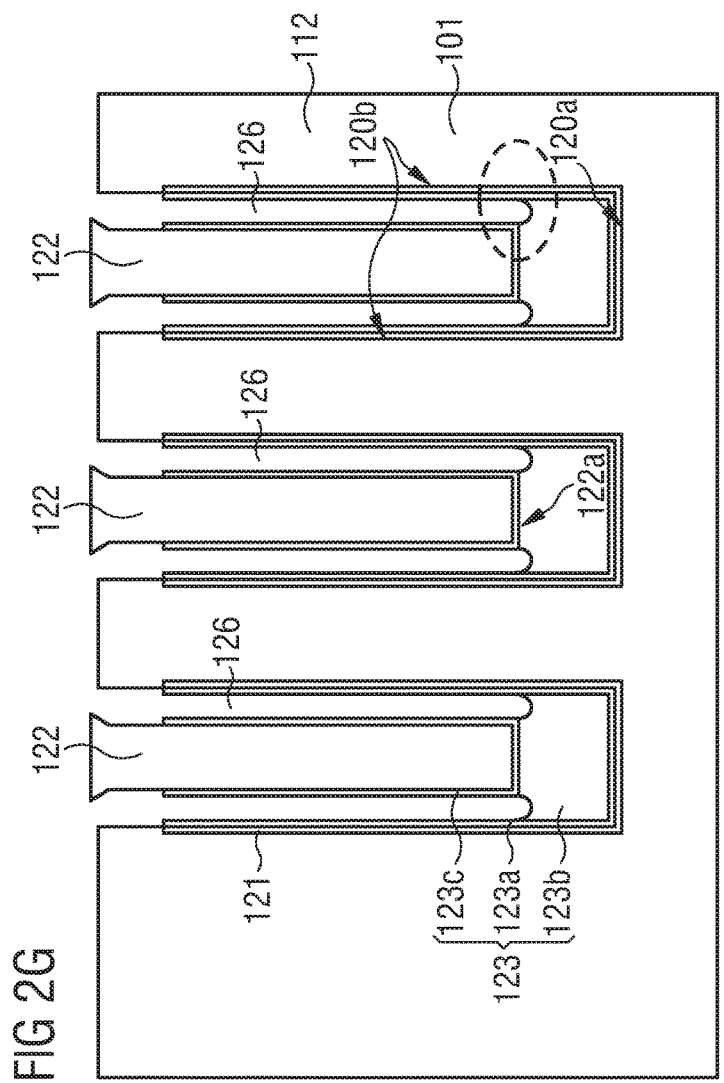

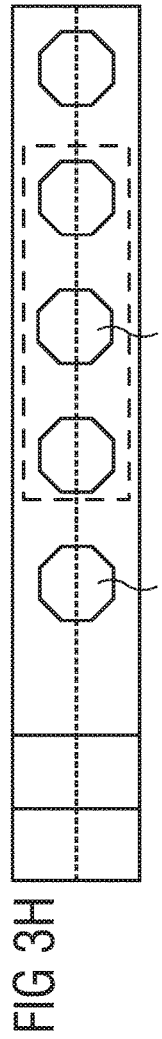
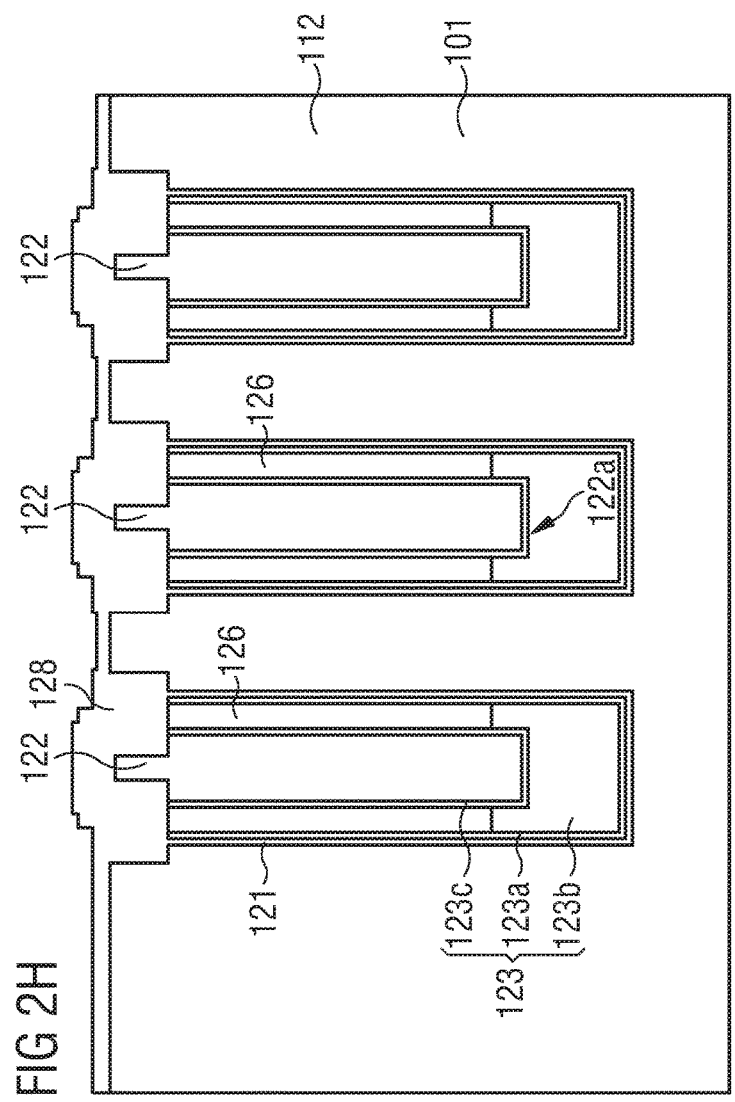

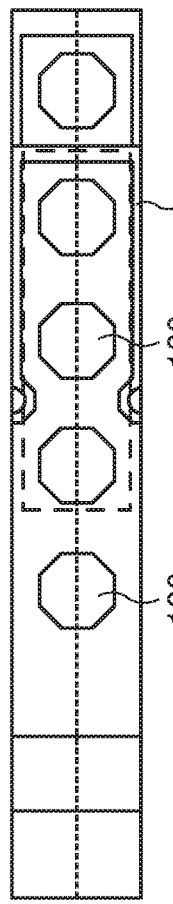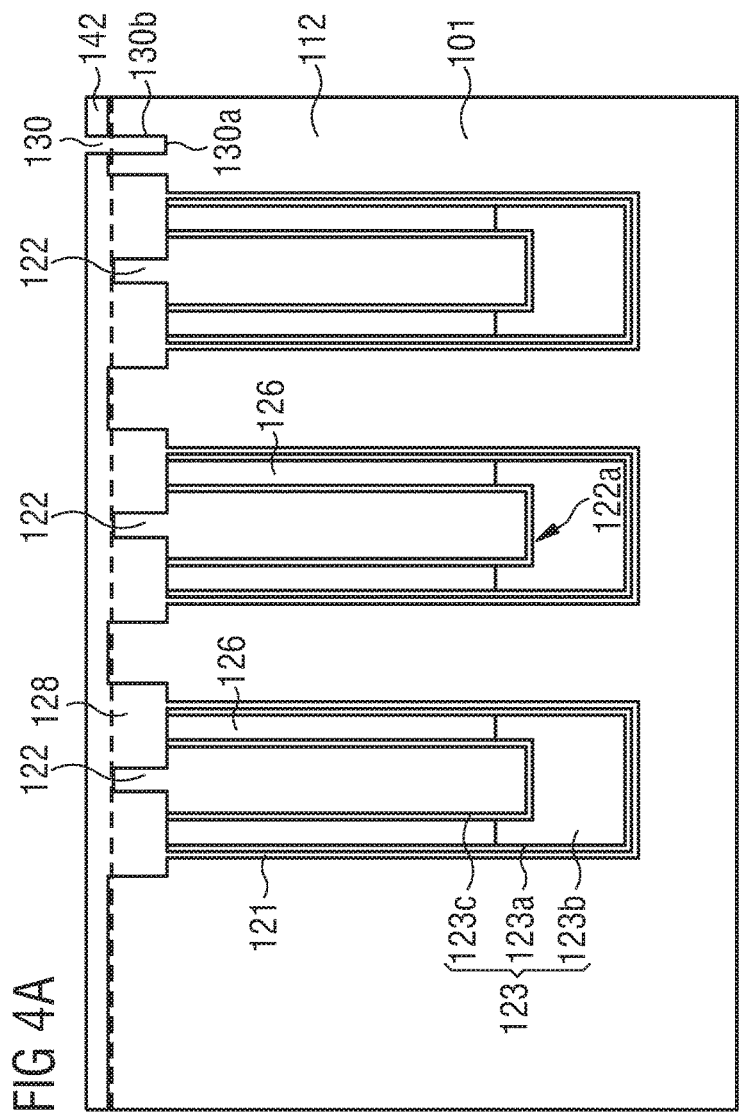
FIG 5A
FIG 4A

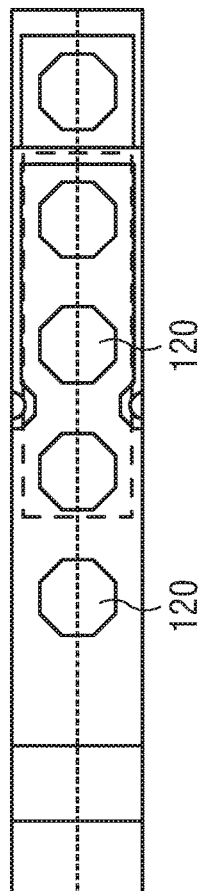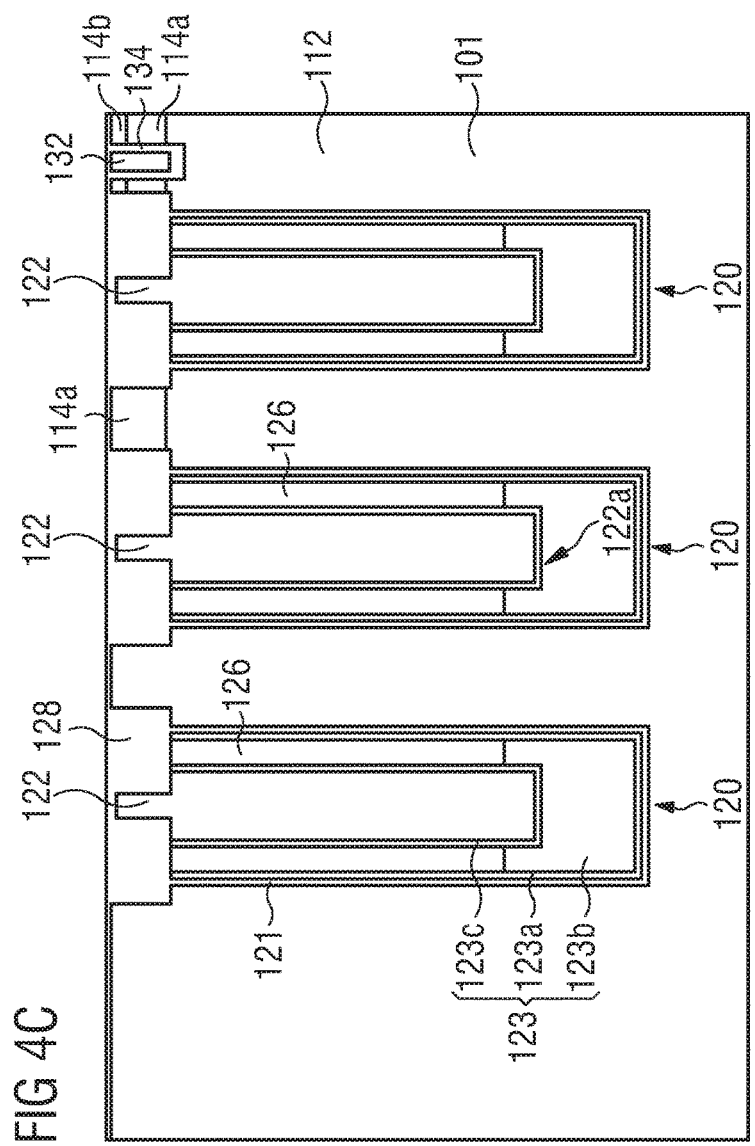

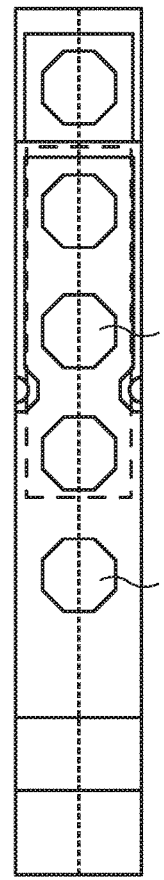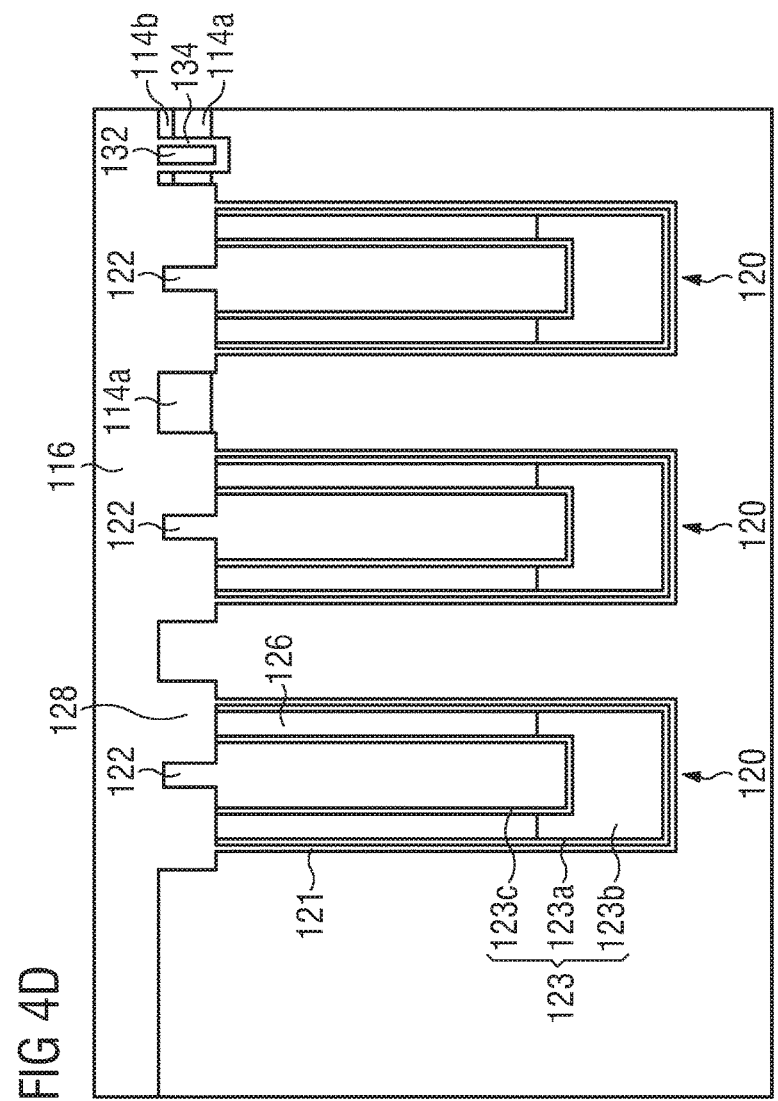

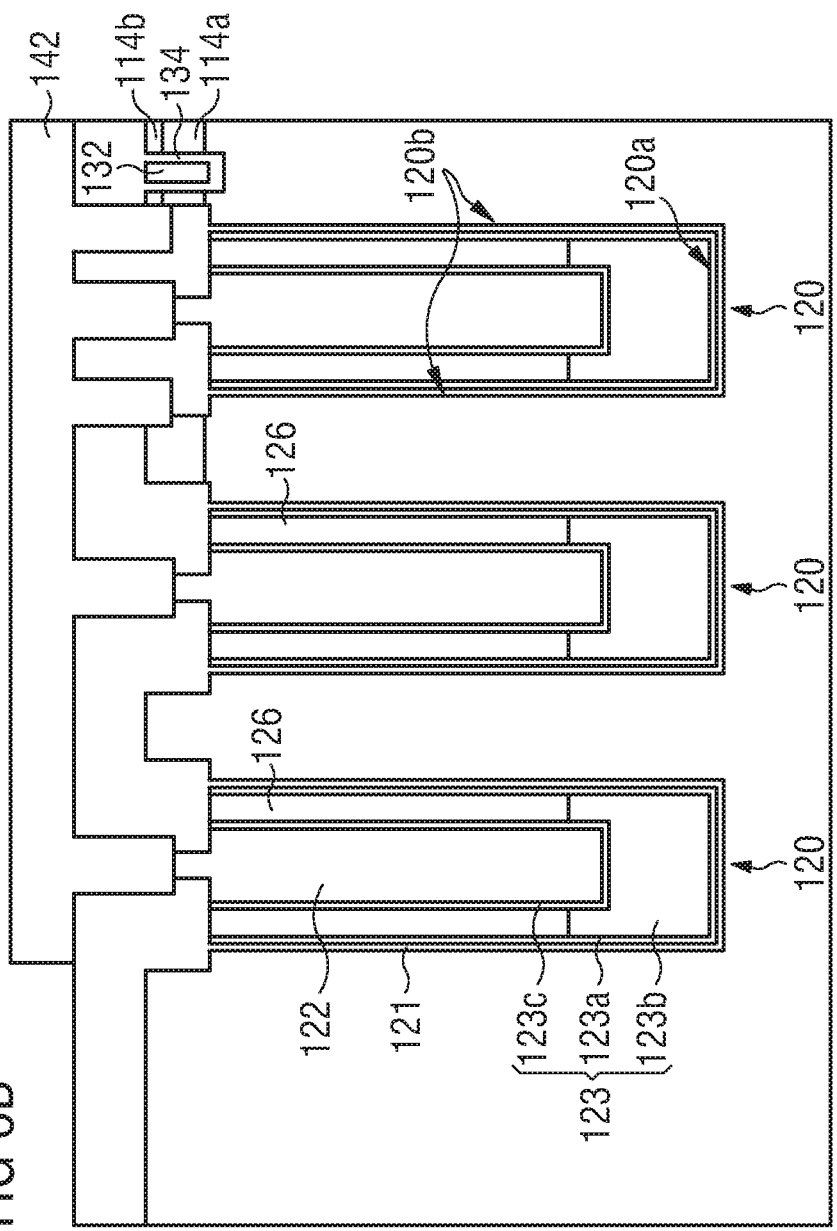

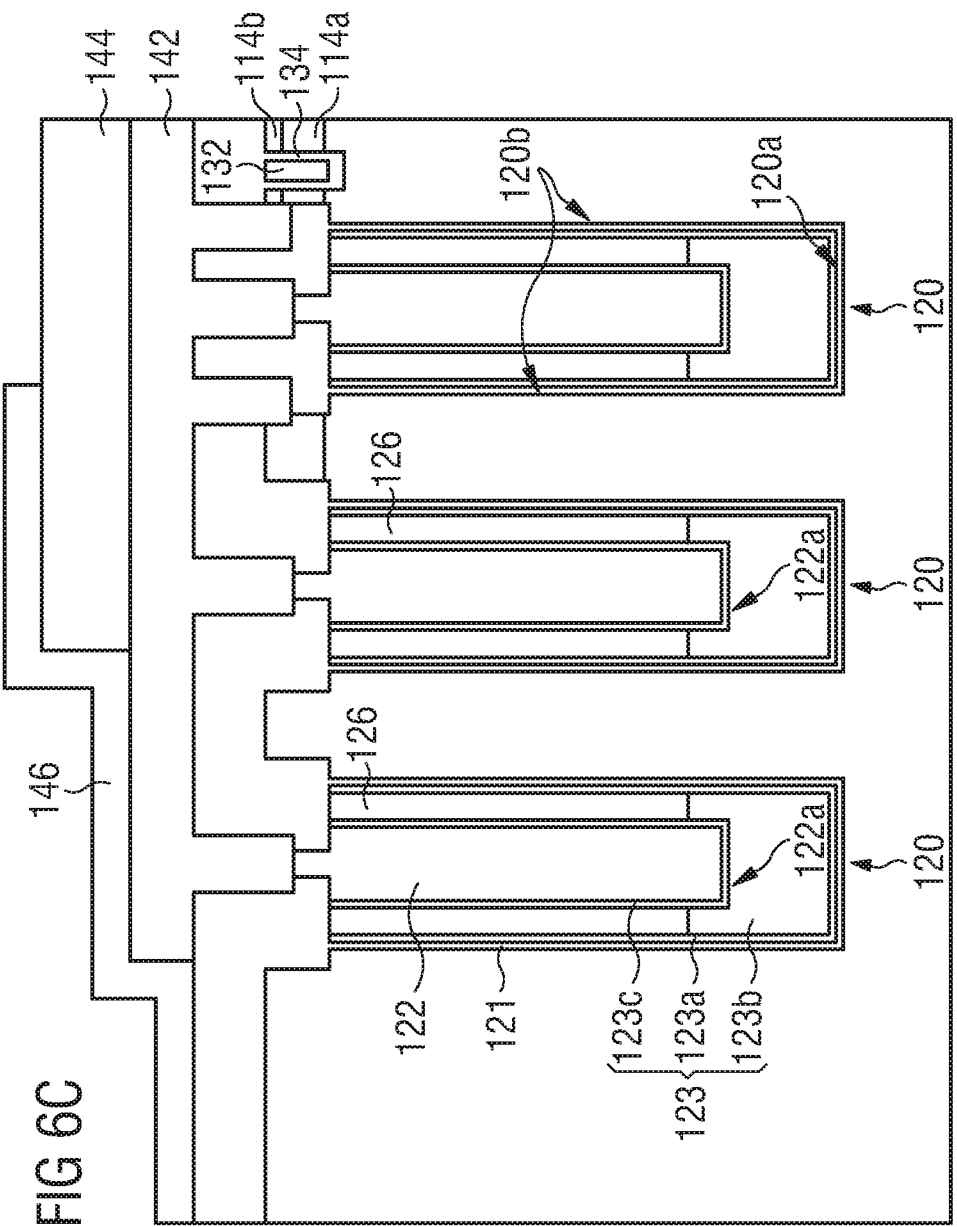

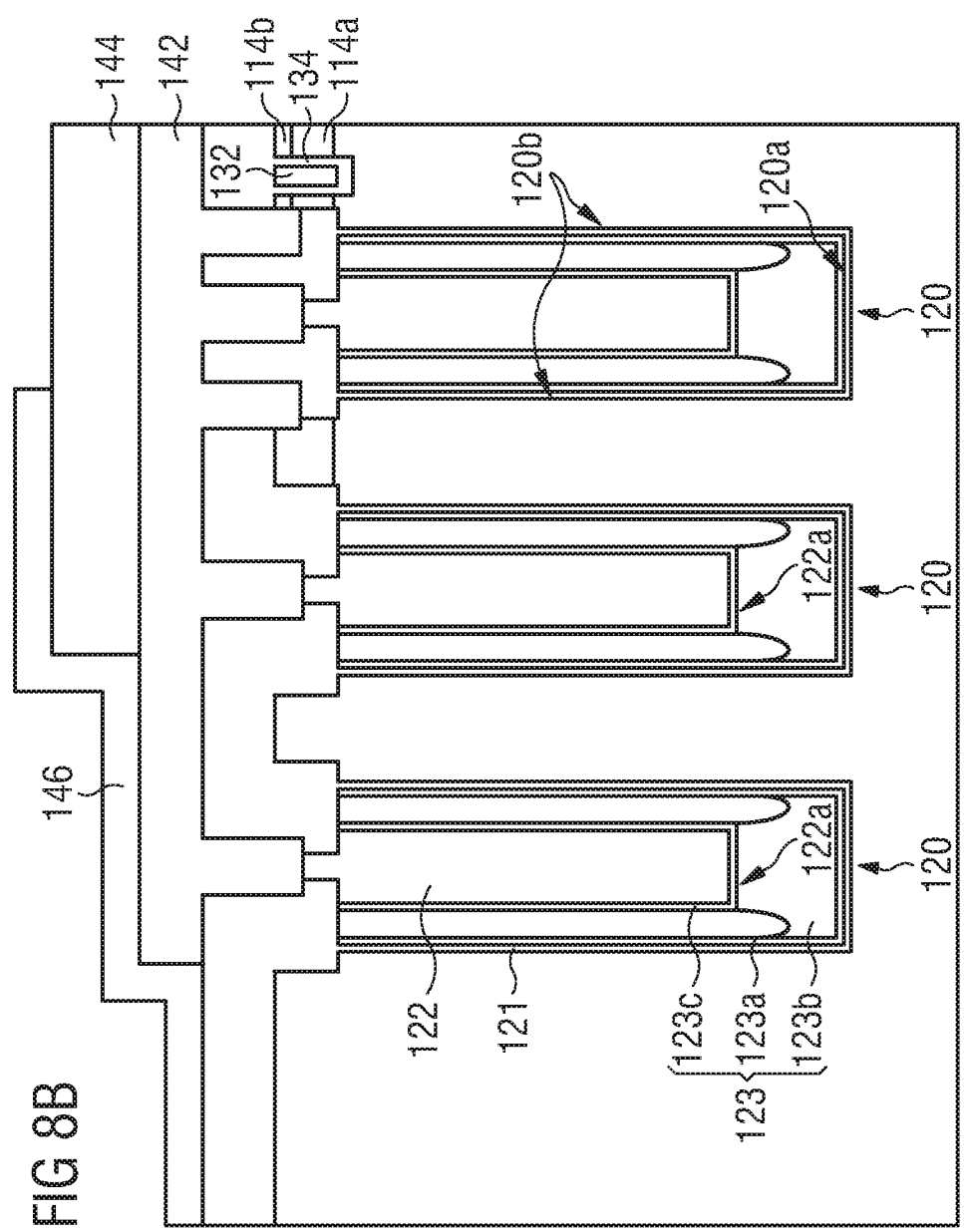

US 9,691,864 B1

SEMICONDUCTOR DEVICE HAVING A CAVITY AND METHOD FOR MANUFACTURING THEREOF

TECHNICAL FIELD

Embodiments described herein relate to methods for manufacturing semiconductor devices having one or more cavities for electrical insulation, and semiconductor devices having such cavities.

BACKGROUND

Conducting structures integrated into semiconductor devices needs to be electrically insulated from other parts of the device to ensure reliable functioning of the semiconductor device. Examples of such conducting structures are field electrodes and gate electrodes which are insulated from the semiconductor substrate by insulation layers such as oxide layers. As comparably high voltages may occur between field electrodes and the semiconductor substrate during operation of the semiconductor device, the insulation layer needs to be thick to prevent electrical breakdown. However, thick insulation layers need more space and increases the size of the respective device.

In view of the above, there is a need for improvement.

SUMMARY

According to an embodiment, a method for manufacturing a semiconductor device includes: providing a semiconductor substrate having a first side; forming at least one recess in the semiconductor substrate, the at least one recess having a bottom and a sidewall extending from the bottom to the first side of the semiconductor substrate; forming an auxiliary structure on the sidewall and the bottom of the at least one recess and forming a hollow space within the at least one recess; filling the hollow space of the at least one recess with a filling material for forming a filling structure in the at least one recess; removing portions of the auxiliary structure from the sidewall of the at least one recess so as to form at least one cavity between the filling structure and the sidewall of the at least one recess; and sealing the at least one cavity at the first side of the semiconductor substrate.

According to an embodiment, a power semiconductor device includes: a semiconductor substrate having a drift region; a gate electrode trench in the semiconductor substrate, extending into the drift region and comprising a gate electrode, the gate electrode arranged in the gate electrode trench and electrically insulated from the drift region by a gate dielectric layer arranged between the gate electrode and the drift region; and a field electrode needle trench in the semiconductor substrate, laterally spaced from the gate electrode trench and extending into the drift region, the field electrode needle trench comprising a field electrode arranged in the field electrode needle trench and electrically insulated from the drift region by a cavity formed between the field electrode and the drift region.

Those skilled in the art will recognise additional features and advantages upon reading the following detailed description, and upon viewing the accompanying drawings.

BRIEF DESCRIPTION OF THE DRAWINGS

The components in the figures are not necessarily to scale, instead emphasis being placed upon illustrating the principles of the invention. Moreover, in the figures, like reference signs designate corresponding parts. In the drawings:

FIGS. 1A to 1C illustrate processes according to an embodiment.

FIGS. 2A to 2H illustrate, in a cross-sectional view of a semiconductor substrate, further processes according to an embodiment.

FIGS. 3A to 3H illustrate the processes of FIGS. 2A to 2H in a top view onto the semiconductor substrate.

FIGS. 4A to 4D illustrate, in a cross-sectional view of a semiconductor substrate, further processes according to an embodiment.

FIGS. 5A to 5D illustrate the processes of FIGS. 4A to 4D in a top view onto the semiconductor substrate.

FIGS. 6A to 6C illustrate, in a cross-sectional view of a semiconductor substrate, further processes according to an embodiment.

FIGS. 8A and 8B illustrate, in a cross-sectional view of a semiconductor substrate, semiconductor devices according to embodiments.

DETAILED DESCRIPTION

Figure 3A:
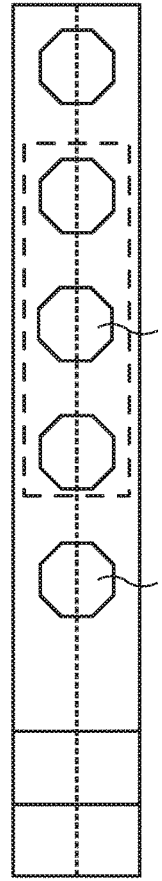

In the following Detailed Description, reference is made to the accompanying drawings, which form a part hereof, and in which are shown by way of illustration specific embodiments in which the invention may be practiced. In this regard, directional terminology, such as "top", "bottom", "front", "back", leading", "trailing", "lateral", "vertical" etc., is used with reference to the orientation of the Figure(s) being described. These terms are intended to encompass different orientations of the device in addition to different orientations than those depicted in the figures. Because components of embodiments can be positioned in a number of different orientations, the directional terminology is used for purpose of illustration and is in no way limiting. Further, terms such as "first", "second", and the like, are also used to describe various elements, regions, sections, etc. and are also not intended to be limiting. Like terms refer to like elements throughout the description. It is to be understood that other embodiments may be utilised and structural or logical changes may be made without departing from the scope of the present invention. The following detailed description, therefore, is not to be taken in a limiting sense, and the scope of the present invention is defined by the appended claims. The embodiments being described use specific language, which should not be construed as limiting the scope of the appended claims.

In this specification, a second surface of a semiconductor substrate is considered to be formed by the lower or backside surface while a first surface is considered to be formed by the upper, front or main surface of the semiconductor substrate. The terms "above" and "below" as used in this specification therefore describe a relative location of a structural feature to another structural feature with consideration of this orientation.

The terms "electrical connection" and "electrically connected" describes an ohmic connection between two elements.

Some embodiments are described next with reference to the Figures. Each example is provided by way of explanation of the disclosure and is not meant as a limitation of the disclosure. Further, features illustrated or described as part of one embodiment can be used on or in conjunction with other embodiments to yield yet a further embodiment. It is intended that the description includes such modifications and variations.

The embodiments illustrated in the Figures mainly pertain to power semiconductor devices without being limited thereto. The power semiconductor devices typically includes a first major electrode on an upper or first side of a semiconductor substrate and a second major electrode on lower or second side of the semiconductor substrate. A current path is defined between the first major electrode and the second major electrode, which current path extend across at least one pn-junction formed in the semiconductor substrate between the first side and the second side. The current path can be controllable through a control electrode which is also referred to as gate electrode.

FIG. 1A shows a semiconductor substrate 101. The semiconductor substrate 101 can have first side 101a. Further, the semiconductor substrate 101 can have a second side 101b opposite the first side 101a. According to embodiments, the semiconductor substrate 101 includes a drift region 112 which can be lightly n-doped. In the following, the semiconductor substrate is referred to as substrate.

For instance, the substrate 101 can be made of any semiconductor material suitable for manufacturing semiconductor components. Examples of such materials include, without being limited thereto, elementary semiconductor materials such as silicon (Si), group IV compound semiconductor materials such as silicon carbide (SiC) or silicon germanium (Site), binary, ternary or quaternary III-V semiconductor materials such as gallium arsenide (GaAs), gallium phosphide (GaP), indium phosphide (InP), gallium nitride (GaN), aluminium gallium nitride (AlGaN), indium gallium phosphide (InGaPa) or indium gallium arsenide phosphide (InGaAsP), and binary or ternary II-VI semiconductor materials such as cadmium telluride (CdTe) and mercury cadmium telluride (HgCdTe) to name few. The above mentioned semiconductor materials are also referred to as homojunction semiconductor materials. When combining two different semiconductor materials a heterojunction semiconductor material is formed. Examples of heterojunction semiconductor materials include, without being limited thereto, silicon ($Si_xC_{1-x}$) and SiGe heterojunction semiconductor material. For power semiconductor applications currently mainly Si, SiC, GaN, materials are used for the substrate 101. Further, the substrate 101 can include an epitaxially grown layer which may form the drift region. Further doping regions such as p-doped body regions forming pn-junctions with the drift region can be integrated into the substrate 101.

Continuing with FIG. 1B, according to some embodiments, at least one recess 120 can be formed in the substrate 101. Specifically, the at least one recess 120 can be formed in the drift region of the substrate 101. An exemplary process for forming the at least one recess 120 is explained in connection with FIG. 1B showing a top view onto the semiconductor substrate 101 shown in FIG. 10. The dotted line in FIG. 1C indicates the location of the cross-sectional view of FIG. 1B. However, the present disclosure is not limited to this specific process. As it will become more clear from the following description, the at least one recess 120 forms at least one field electrode needle trench 120 in which a field electrode having a column or needle shape is arranged. The field electrodes are finally electrically insulated from the semiconductor substrate 101 by cavities formed around the field electrode in the at least one recess 120. FIG. 1C illustrates that more than one recess 120 can be formed. According to embodiments, a plurality of recesses 120 can be formed in the substrate 101. In the following, reference is made to the plurality of recesses 120 without being limited thereto.

The at least one recess 120 can be generally formed for providing space for a structure that is to be arranged within the recess and that will be surrounded by a cavity so that the structure is spaced from sidewalls of the recess. While the further description refers to field electrode needle trenches, this should not be considered as a limitation. The structure to be formed can be, for example, a conductive structure or a non-conductive structure.

A hard mask 172 can be formed on the substrate 101, specifically on the first side 101a of the substrate 101. For instance, the hard mask 172 can be formed by depositing an inorganic material such as an oxide. An example is depositing TEOS (Tetraethyl Orthosilicate) to a thickness of about 950 nm. A photoresist (not shown) can be deposited on the deposited inorganic material. A portion of the photoresist corresponding to the location of the plurality of recesses 120 to be formed can be removed by photolithographic techniques, exposing a portion of the deposited material that corresponds to the location of the plurality of recesses 120. Accordingly, the portion of the deposited material corresponding to the plurality of recesses 120 can be removed, e.g., by etching, to form the hard mask 172. Thereafter, the photoresist can be removed. The plurality of recesses 120 can be formed by etching the semiconductor substrate 101 using the hard mask 172 as an etching mask.

FIG. 1B shows the formation of the at least one recess 120 from a top view onto the substrate 101. As it is indicated by the dashed line and the dashed frame, the at least one recess 120 or the plurality of recesses 120 or the recesses 120 depicted in FIG. 1B can correspond to an inner region of the substrate 101. Specifically, FIG. 1B shows a border trench 180, which can be formed together with the recesses 120 or in a separate process. The border trench 180 can be used for edge termination. Further, the recesses 120 can have an octagonal shape from a top view. Furthermore, the recesses 120 can have other shapes such as a round shape, etc.

FIGS. 2A to 2H show the recesses 120 in greater detail during further processes. FIGS. 3A to 3H illustrate the processes of FIGS. 2A to 2H in a top view onto the semiconductor substrate 101. According to some embodiments, the recesses 120, specifically each of the recesses 120, can have a bottom 120a and a sidewall 120b extending from the bottom 120a to the first side 101a of the substrate 101. The recesses 120, specifically each of the recesses 120, can have a depth of equal to or more than 1 µm, specifically equal to or more than 3 µm, typically equal to or more than 4 µm, and/or equal to or less than 12 µm, specifically equal to or less than 8 µm, typically equal to or less than 6 µm. Further, the recesses 120, specifically each of the recesses 120, can have a smallest lateral dimension of equal to or more than 100 nm, specifically equal to or more than 200 nm, typically equal to or more than 300 nm, and/or equal to or less than 900 nm, specifically equal to or less than 700 nm, typically equal to or less than 500 nm. According to some embodiments, the recesses 120 can be formed to have an aspect ratio of the depth to smallest lateral extension of at least 2:1, particularly of at least 4:1. The geometrical dimensions of the recesses 120, particularly the depth, are typically governed by the rated blocking voltage of the final device.

According to some embodiments, an auxiliary structure 123 can be formed on the sidewall 120b and the bottom 120a of the recesses 120, specifically of each of the recesses 120 if more than one recess 120 is formed. The auxiliary structure 123 can include a first auxiliary layer, a second auxiliary layer, and a third auxiliary layer which are deposited in this order. The first auxiliary and third auxiliary layer can be of the same material to allow selective etching of the second auxiliary layer relative to the first and third auxiliary layer. The first and third auxiliary layer can then also be selectively etched with respect to the second auxiliary layer.

According to an embodiment, the first auxiliary layer can be a first insulating layer, the second auxiliary layer can be a second insulating layer and the third auxiliary layer can be a third insulating layer. According to a further embodiment, at least one the first to third auxiliary layers is a conductive layer and another one of the first to third auxiliary layers is an insulating layer. According to another embodiment, each of the first to third auxiliary layers is a conductive layer. The second auxiliary layer is arranged between the first and the second auxiliary layer.

According to an embodiment, the first auxiliary layer is a nitride layer such as a silicon nitride. According to an embodiment, the second auxiliary layer is an oxide layer such as a silicon oxide. According to an embodiment, the third auxiliary layer is a nitride layer such as a silicon nitride. The second auxiliary layer is arranged between the first and the second auxiliary layer.

Figure 2A:
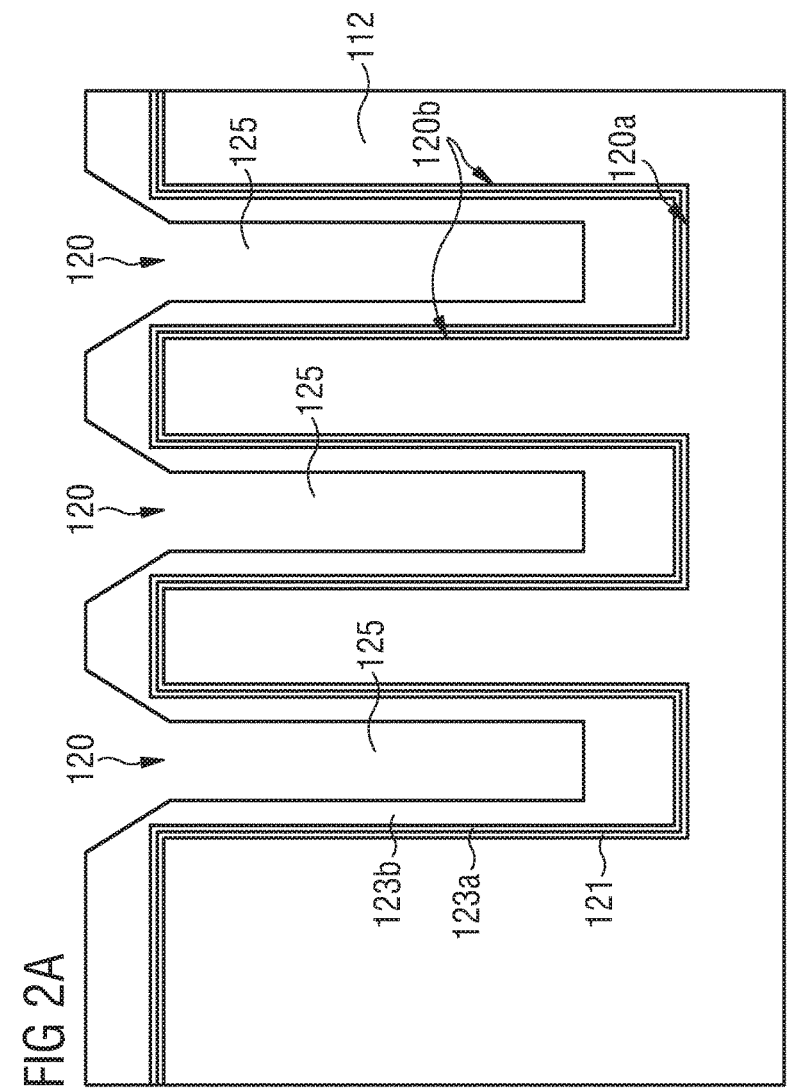
Figure 3B:
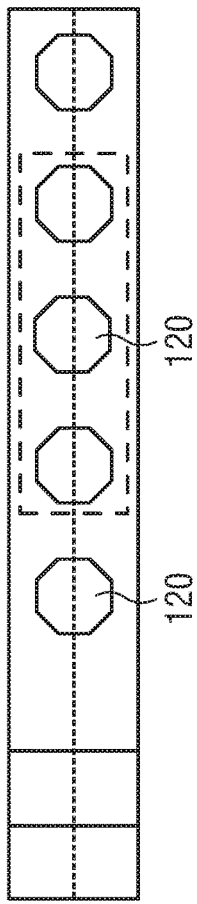

As best shown in FIG. 2A, an oxide layer 121 can be formed prior to the formation of the auxiliary structure 123 to cover surface portions of the recesses 120. For instance, the oxide layer 121 can be formed by thermal oxidation. The oxide layer 121 can form a pad layer between the auxiliary structure 123 and the semiconductor substrate 101. For instance, the oxide layer is formed by thermal oxidation, e.g. to a thickness of about 10 to about 20 nm. Is shown in FIG. 2A, the oxide layer 121 can cover the first side 101a of the substrate 101 and/or the bottom 120a and the sidewall 120b of the recesses 120. Typically, the oxide layer 121 is a silicon dioxide layer 121. When practicing embodiments, the oxide layer or pad layer can provide relief for mechanical stress through process heat cycles and in particular during the thermal oxidation for the insulating plug (described later). Specifically, if the oxide layer were not used during this step in praxis there could be higher stress in the substrate causing crystal lattice damage. Furthermore, if nitride is deposited directly on the sidewall of the trench this could be a source of interface charge states which would be far less stable and predictable than for a thermally grown pad oxide, such as the oxide layer. Accordingly, the oxide layer 121 can increase device performance.

The oxide layer 121 can form part of the auxiliary structure 123, particularly when the auxiliary structure 123 forms an insulating structure.

Prior to forming the oxide layer 121, upper edges of the recesses 120 can be rounded by thermally oxidizing exposed semiconductor material with subsequent removal of the such formed thermal oxide. The thickness of the temporarily formed thermal oxide can be about 150 nm which is sufficient for rounding the edges.

The auxiliary structure 123, which can be formed either directly on the sidewall 120b and the bottom 120a or on the above described oxide layer 121, can include a first auxiliary material on the sidewall 120b and/or the bottom 120a of the recesses 120b to form a first auxiliary layer 123a. Specifically, the first auxiliary material can be conformally deposited on the sidewall 120b and/or the bottom 120a of the respective recesses 120, or on the oxide layer 121 if formed previously. For instance, the first auxiliary material can be conformally deposited by LPCVD (Low-pressure Chemical Vapour Deposition) process. The first auxiliary material can be a silicon nitride. Specifically, the first auxiliary material can be a first auxiliary material and the first auxiliary layer 123a can be a first insulating layer 123a. Further, the first auxiliary layer 123a can have a thickness of equal to or more than 2 nm, specifically equal to or more than 5 nm, typically equal to or more than 15 nm, and/or equal to or less than 25 nm, specifically equal to or less than 50 nm, typically equal to or less than 10 nm.

The auxiliary structure 123 can further include a second auxiliary material on the first auxiliary layer 123a to form a second auxiliary layer 123b on the first auxiliary layer 123a. Typically, the second auxiliary layer 123b completely covers the first auxiliary layer 123a.

The second auxiliary material can be deposited on the first auxiliary layer 123a. For instance, the second auxiliary layer 123b can be formed by CVD (chemical vapour deposition), HDP CVD (high-density plasma chemical vapour deposition), TEOS (Tetraethyl Orthosilicate) deposition, and/or PSG (phosphosilicate glass) deposition. According to some embodiments, the second auxiliary layer 123b can be formed by HDP oxide deposition, dipping back the HDP oxide the sidewall 120b of the recesses 120 while leaving the HDP oxide on the bottom 120a of the recesses 120, and/or depositing a TEOS oxide and/or PSG on the sidewalls 120b of the recesses 120. When practicing embodiments, the TEOS oxide and/or PSG deposition on the sidewalls 120b of the recesses 120 can enable desired profile of the second auxiliary layer 123b. Further, the deposition of PSG can enable faster etch rates as compared to TEOS oxide. Specifically, the second auxiliary material can be a second insulating material and the second auxiliary layer 123a can be a second insulating layer 123a.

The second auxiliary layer 123b can have a thickness chosen to be equal in dimension to the intended vacuum/gaseous gap and as intended for the breakdown voltage rating of the device. For example, the thickness of the second auxiliary layer 123b can be equal to or more than 20 nm, specifically equal to or more than 40 nm, typically equal to or more than 200 nm, and/or equal to or less than 300 nm, specifically equal to or less than 500 nm, typically equal to or less than 1000 nm. According to some embodiments, the thickness of the first auxiliary layer 123a can be smaller than the thickness of the second auxiliary layer 123b.

Figure 2B:
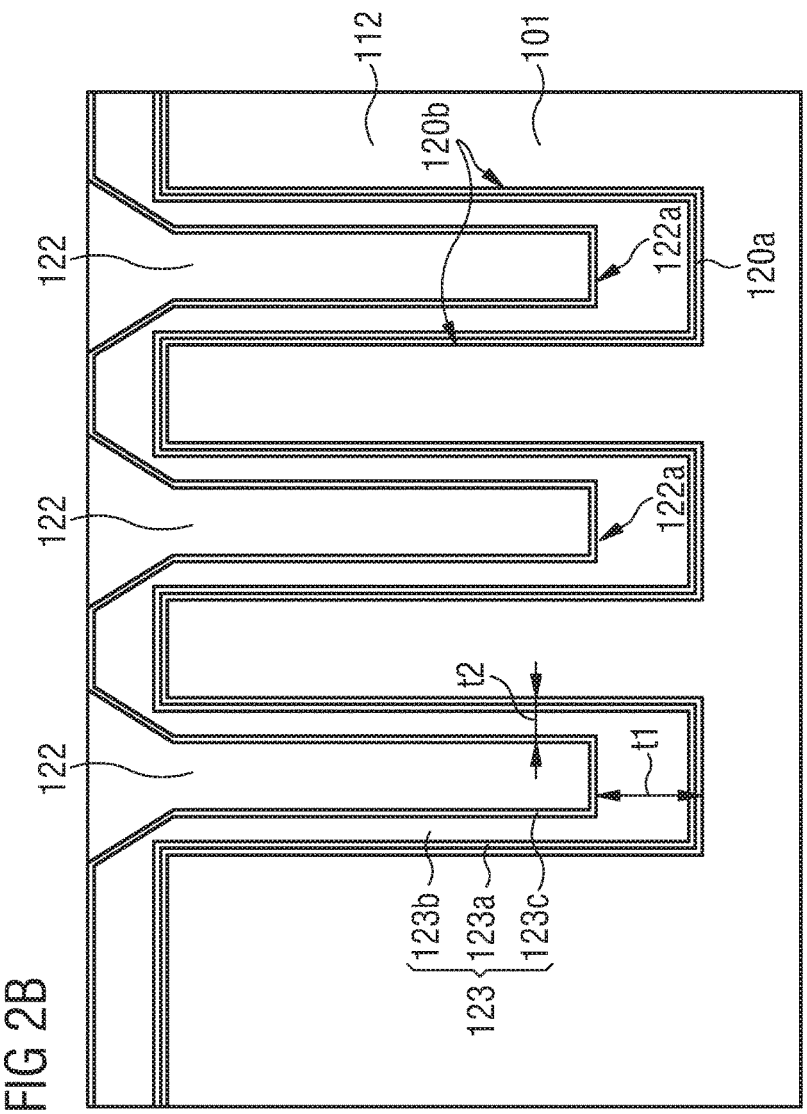
Figure 3D:
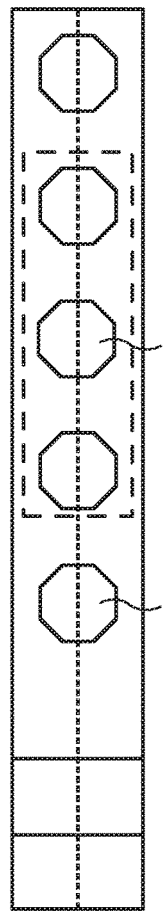

As shown in FIG. 2B, the auxiliary structure 123 can further include a third auxiliary material on the second auxiliary layer 123b to form a third auxiliary layer 123c arranged on the second auxiliary layer 123b. Specifically, the third auxiliary material can be conformally deposited on second auxiliary layer 123b. For instance, the third auxiliary material can be conformally deposited by LPCVD (Low-pressure Chemical Vapour Deposition) process. The third auxiliary material can be silicon nitride. Specifically, the third auxiliary material can be a third insulating material and the third auxiliary layer 123c can be a third insulating layer 123a Further, the third auxiliary layer 123c can have a thickness of equal to or more than 5 nm, specifically equal to or more than 10 nm, typically equal to or more than 18 nm, and/or equal to or less than 23 nm, specifically equal to or less than 30 nm, typically equal to or less than 40 nm.

According to embodiments, the third auxiliary layer 123c can include the same material as the first auxiliary layer 123a and/or can be formed by a corresponding process. Specifically, the first auxiliary material and/or the third insulating auxiliary can be oxygen-resistant materials, specifically a material that is impervious to oxygen diffusion. For instance, the first auxiliary material and/or the third auxiliary material are a silicon nitride and the first auxiliary layer 123a and/or the third auxiliary layer 123c are silicon nitride layers.

According to some embodiments, the auxiliary structure 123 can be formed such to keep a hollow space 125 within the recesses 120, specifically within each of the recesses 120. Further, the auxiliary structure 123 can be formed to have a first thickness t1 at the bottom 120a of the recesses 120 and a second thickness t2 at the sidewall 120b. According to some embodiments, the first thickness t1 is at least 2-time, particularly at least 3-times, larger than the second thickness t2. The thicknesses t1 and t2 are illustrated in FIG. 2B.

As shown in FIG. 2B, each of the first and the third auxiliary layers 123a, 123c has substantially the same thickness on the bottom 120a and the sidewalls 120b of the recesses due to the conformal deposition processes used for forming the first and the third auxiliary layers 123a, 123c. Both the first and the third auxiliary layers 123a, 123c can have the same thickness or can have a different thickness.

Different thereto, the second auxiliary layer 123b has a larger thickness on the bottom 120a than on the sidewall 120b, typically by a factor of at least 2 or at least 3. The overall thickness and the thickness variation of the auxiliary structure 123 is thus determined mainly by the second auxiliary layer 123b which is thicker than the first and second auxiliary layers 123a, 123c.

As shown in FIG. 2B, the hollow space 125 of the respective recess 120 is filled with a filling material for forming respective filling structures 122 in the recesses 120. The filling structures 122, specifically each of the filling structures 122, can have a lower end 122a opposite, and specifically spaced from, the bottom 120a of the respective recess 120. The filling structures 122 can be formed, e.g., by depositing a filling material on the first side 101a of the substrate 101 to fill the recesses 120. The filling material can be removed from the first side 101a of the substrate 101, leaving filling material in the recesses 120, specifically to a height corresponding to a height of the auxiliary structure 123. That is, a surface of the filling structures 122, specifically a surface of the filling structures 122 opposite to the lower end 122a, can be flush with a surface of the auxiliary structure 123. The filling material can be a doped or undoped polycrystalline semiconductor material, such as poly-Si, doped amorphous silicon, tungsten silicide, refractory metal silicide, titanium nitride, refractory metal, and/or combinations thereof. Although a primary material of the filling structure 122 can be either polysilicon or amorphous silicon it is possible to include a more conductive material such as those listed within and encapsulated by the polysilicon or amorphous silicon.

Specifically, the filling material can be an electrically conductive material and the filling structure 122 can be an electrically conductive structure 122. The electrically conducting structures 122 may form field electrodes arranged in the recesses 120, or needle trenches, in the final device.

According to a further embodiment, the filling material is an electrically insulating material and the filling structure 122 forms an electrically insulating structure.

As shown in FIG. 2C, the filling structures 122 can be etched to remove a portion of filling structures 122 protruding from the first side 101a of the substrate 101. That is, the filling structures 122 can be etched so that a surface of the filling structures 122, specifically a surface of the filling structures 122 opposite to the lower end 122a, can be flush with the first side 101a of the substrate 101. Further, a DHF (diluted hydrofluoric acid) dip can be performed for conversion oxide.

According to embodiments, portions of the third auxiliary layer 123c, specifically portions of the third auxiliary layer 123c that have been exposed by the previous processes, can be removed. These portions can in particular correspond to an area outside of the recesses 120. The third auxiliary layer 123c can be, specifically in case of silicon nitride, removed, e.g., by using phosphoric acid ($H_3PO_4$), particularly selectively to silicon dioxide.

According to some embodiments, the auxiliary structure 123 can be recessed from the first side 101a of the semiconductor substrate 101 to expose the filling structures 122, specifically to laterally expose the filling structures 122, in an upper portion of the recesses 120 which is spaced from a lower portion of the recesses 120. Recessing of the auxiliary structure 123 can include a two-step etching process.

Figure 2D:
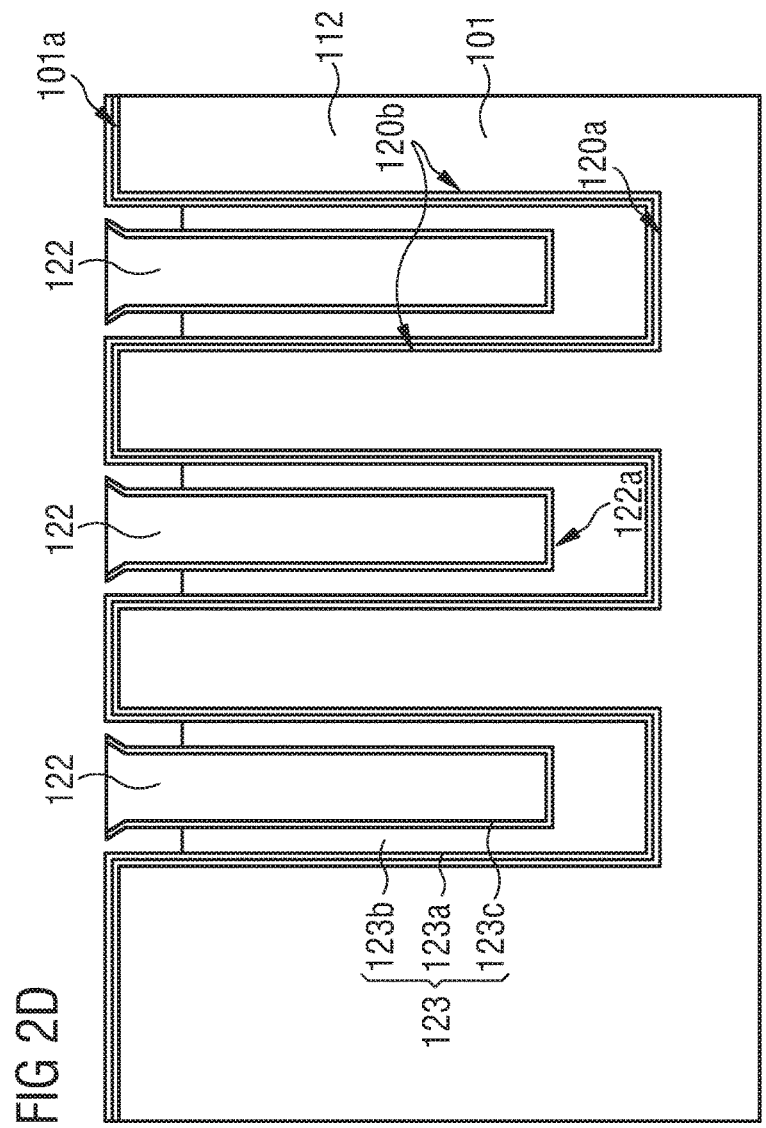
Figure 5B:
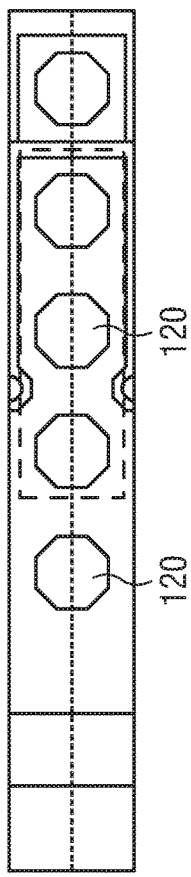

As shown in FIG. 2D, a first etching process can include recessing the second auxiliary layer 123b of the auxiliary structure 123 to below the first side 101a of the substrate 101 in an upper portion of the recesses 120. The recessed upper surface of the second auxiliary layer 123b is arranged within the recess 120 and spaced from the first side 101a of the semiconductor substrate 101. Etching of the second auxiliary layer 123b exposes portions of the first auxiliary layer 123a and the second auxiliary layer 123c in the upper portion of the recesses 120.

The second auxiliary material can be etched selectively to the first and the third auxiliary material to partially remove the second auxiliary layer 123b from the first auxiliary layer 123a and the third auxiliary layer 123c. The second auxiliary layer 123b can be etched back to a depth corresponding to approx. 500 nm defined from the first side 101a. For instance, the second auxiliary layer 123b can be removed from the upper portion by wet etching.

A second etching process can include recessing the first auxiliary layer 123a and the third auxiliary layer 123c in a common process by etching these layers selectively to the material of the second auxiliary layer 123b. The depth to which the second auxiliary layer 123b is removed typically also determines the length of the recessed portion of the auxiliary structure 123.

As shown in FIG. 2E, exposed portions of the first auxiliary layer 123a and the third auxiliary layer 123c can be removed by using phosphoric acid ($H_3PO_4$), specifically to a depth to which the second auxiliary layer 123b has been removed.

According to some embodiments, the upper portion of the recesses 120, in which the auxiliary structure 123 is removed, can have a length of equal to or more than 150 nm, specifically equal to or more than 200 nm, typically equal to or more than 400 nm, and/or equal to or less than 1000 nm, specifically equal to or less than 600 nm, typically equal to or less than 800 nm.

As shown in FIG. 2F, the second auxiliary layer 123b can be further removed, specifically, after removing the first auxiliary layer 123a and the second auxiliary layer 123c in the upper portion of the recesses 120. According to some embodiments, portions of the auxiliary structure 123, specifically of the second auxiliary layer 123b, can be removed from the sidewall 120b of the recesses 120, while optionally leaving a portion of the auxiliary structure 123 between the lower end 122a of the filling structures 122 and the bottom 120a of the respective recesses 120 in a lower portion of the recesses 120, to form cavities 126 between the filling structures 122 and the sidewall 120b of the recesses 120. The cavities 126 can provide insulation between the filling structures 122 and the substrate 101.

According to some embodiments, the portion of the auxiliary structure 123 which is left at the bottom 120a of the recesses 120 can have a vertical length that is larger than a distance between the bottom 120a of the recesses 122 and the lower end 122a of the filling structures 122. That is, the auxiliary structure 123 left at the bottom 120a of the recesses 120 can extend to above the lower end 122a of the filling structures 122, specifically encompassing a lower portion of the filling structures 122 from side surfaces of the filling structures 122. The portion of the auxiliary structure 123 left at the bottom 120a of the recesses 120 provides stable support for the filling structures 122.

The second auxiliary layer 123b can be removed for forming the cavities 126 by wet etching, specifically by a wet etching process having an isotropic etch rate, such as a HF vapour or Dilute HF solution. The cavities 126 can have a width of equal to or more than 50 nm, specifically equal to or more than 100 nm, typically equal to or more than 150 nm, and/or equal to or less than 300 nm, specifically equal to or less than 250 nm, typically equal to or less than 200 nm. The width of the cavities 126 can correspond to a distance from the first auxiliary layer 123a covering the sidewall 120b of the recesses 120 to the third auxiliary layer 123c covering the filling structures 122. The cavities 126 defined by the auxiliary structure 123 insulates the electrically conducting structures 122 from the surrounding semiconductor substrate 101. As the cavities are void, the width of the cavities 126 can be made smaller in comparison to the case when the cavities 126 would be filled with an insulating material. The decrease of the width of the cavities 126 while maintaining the insulating properties is due to the lower relative permittivity of vacuum or remaining air in the cavities 126 as compared to the permittivity of an insulating material. When compared to silicon dioxide having a relative permittivity of approximately 3.9, the cavities 126 can be formed smaller by a factor of about 3.9 while providing the same dielectric properties as the permittivity of air or vacuum is about 1.

FIG. 2F highlights an area corresponding to the upper portion of the recesses 120 by a circle. In praxis, there can be a risk that the filling structures 122 breaks or tilts so that the lateral distance between the sidewall 120b of the respective recess 120 and the respective filling structure 122 changes. The change of the distance can lead to a change of the capacitance between the substrate 101 and the respective filling structure 120 and to a reduced electrical insulation, resulting in altered, specifically worsen, insulating properties of the respective cavity 126. To prevent that the filling structures 122 may tilt, a portion of the auxiliary structure 123 can be left at the bottom 120a of the recesses 120 to enable stable support for the filling structures 122. If a stable support is provided by other means such as by keeping webs of the material of the filling structures 122 in the upper portion of the recesses 120 or on the first side 101a, the auxiliary structure 123 can be completely removed at the bottom of the recesses 120.

Further, also illustrated in some figures, the fillings structures 122 are not limited to the depicted funnel shape at the upper portion of the filling structures 122. For instance, FIG. 2F illustrates the fillings structures 122 with a straight sidewall, specifically in the upper part. It is intended that the present disclosure includes such modifications and variations of the shape of the filling structures 122.

FIG. 2G highlights an area corresponding to the lower portion of the recesses 120 by a circle. As shown in FIG. 2G, the auxiliary structure 123, specifically the second auxiliary layer 123b can be recessed further at least partially from the sidewalls 120b of the recesses 120 in an area between the lower end 122a of the filling structures 122 and the bottom 120a of the recesses 120 as indicated by the circle. According to some embodiments, the auxiliary structure 123, specifically the second auxiliary layer 123b, can be anisotropically etched in the area between the lower end 122a of the filling structures 122 and the bottom 120a of the recesses 120. When practicing embodiments, the anisotropic etch can enable a removal of the second auxiliary material 123b from the sidewall 120b of the recesses 120 while leaving the second auxiliary layer 123b at the bottom 120a of the recesses 120. An isotropic etching would also be possible. Specifically, the second auxiliary material 123b can be left at the bottom 120a of the recesses 120 with the thickness t2, spanning the full gap between the bottom 120a of the recesses 120 and the lower end 122a of the filling structure 122.

In view of the electric properties of the auxiliary structure 123 it can be beneficial to etch the second auxiliary layer 123a down to the bottom 120a of the recesses 120 as far as possible. However, in view of the anchoring effect provided by the auxiliary structure 123, in particular by the second auxiliary layer 123b, for holding the filling structure 122 it can be beneficial to leave material of the second auxiliary layer 123a. Accordingly, for structures being fragile and tend to break, more material of the second auxiliary layer 123a can be left while for structures in which the dielectric properties are more important, more material can be removed below the lower end 122 of the filling structures 122.

FIG. 2H shows closing or sealing of the recesses 122. According to some embodiments, the plurality of recesses 122 can be closed by an insulating plug 128 formed in an upper portion of the respective recess 120. For instance, the insulating plug 128 can be formed by thermally oxidizing an upper portion of the filling structures 122. The upper portion of the filling structures 122 may by defined by the upper end of the first and third auxiliary layers 123a, 123c. Parts of semiconductor material that is not covered by the first and third auxiliary layers 123a, 123c are subjected to the oxidation and are consumed. Thus, an oxide plug 128 is formed by partially consuming the upper portion of the filling structures 122, which can be an electrically conductive structure 122 as disclosed herein, and portions of the semiconductor substrate 101. Since heavily doped polysilicon semiconductor material oxidizes faster than mono-crystalline semiconductor material, the insulating or oxide plug 128 is mainly formed by oxidising material of the filling structures 122.

Thermal oxidation grows an oxide on the first side 101a of the substrate 101 and partially in the recesses 120. In particular, the thermal oxide partially consumes and thus grows on the filling structures 122 and on the sidewall 120b of the recesses 120. Specifically, a thermal oxide can grow on the exposed portions of the filling structures 122 the sidewall 120b of the recesses 120, i.e. the portions of the filling structures 122 not covered by the first and third auxiliary layer 123a, 123c and portions of the sidewall 120b of the recesses 120 not covered by the first auxiliary layer 123a. When practicing embodiments, a depth to which the first and third insulating auxiliary 123a, 123c are removed when recessing the auxiliary structure 123 typically determines the vertical extension of the insulating plugs 128 into the recesses 120. The first and third auxiliary layers 123a, 123c are provided as an oxidation barrier to restrict formation of the thermal oxide in regions that are not covered and protected by the first and third auxiliary layers 123a, 123c.

As can be further seen from FIG. 2H, the growth rate of the thermal oxide forming the insulating plug 128 can be higher on the filling structures 122 than on the substrate 101. This is illustrated by a thinner oxide layer on the first side 101a of the substrate 101. For instance, the growth rate of the insulating plug 128 can be about two times to about four times higher on the filling structures 122 than on the substrate 101.

When practicing embodiments, a gas, specifically a processing gas, such as oxygen ($O_2$), water vapour ($H_2O$), nitrogen ($N_2$), argon (Ar) and/or combinations thereof, can be sealed in the cavities 126. During thermal oxidation, the oxygen ($O_2$) and/or water vapour ($H_2O$) in the gas sealed in the cavities 126 is consumed leading to a reduced vapour pressure or vacuum level in the cavities 126 than in surrounding areas, such as above the first side 101a of the substrate 101.

According to embodiments, a plurality of insulating plugs 128 can be formed in the recesses 122. Specifically, an insulating plug 128, specifically a separate insulating plug 128, can be formed in each of the recesses 122.

Processing of the semiconductor device 100, such as forming gate trenches, body regions, and/or source regions, is described in connection with FIGS. 4A to 4D and 5A to 5D. FIGS. 4A to 4D show a cross-sectional view while FIGS. 5A to 5D show a top view.

As shown in FIG. 4A, the first side 101a of the substrate 101, specifically the insulating plug 128, can be polished, e.g. by a chemical-mechanical planarization (CMP) process, such as a CEROXID CMP process. In this context, a CEROXID CMP process can be a CMP process employing a Ceroxide containing polishing fluid. Ceroxide in turn can be an oxide of the rare earth metal cerium. For instance, material of the insulating plug 128 above the first side 101a, as well as the thermal oxide formed on the first side 101a of the substrate 101, can be partially or completely removed, e.g. by the CMP process, to an extent that material of the insulating plug 128 is partially removed at the first side 101a of the substrate 101 and left in the recesses 122. The CMP process thus removes all oxide above the first side 101a so that a flat surface is formed. The semiconductor material of the semiconductor substrate 101 can thus be exposed at the first side 101a. The level to which the oxide material is removed is indicated in FIG. 4A by a dashed line.

FIGS. 4A and 5A further show forming of at least one trench 130. According to embodiments, the at least one trench 130 is typically formed after the formation of the at least one recess 120. Specifically, the at least one trench 130 can be formed after closing or sealing the at least one recess 120 by the insulating plugs 128. The at least one trench 130 can be at least one gate trench for accommodating a gate electrode. Typically, the at least one trench 130 is formed in the so-called active area of the final semiconductor device.

A trench hard mask 142 can be deposited on the substrate 101, specifically on the exposed first side 101a of the substrate 101. For instance, the trench hard mask 142 can be formed by depositing TEOS (Tetraethyl Orthosilicate), e.g. to a thickness of about 410 nm. A photoresist (not shown) can be deposited on the trench hard mask 142. A portion of the photoresist corresponding to the at least one trench 130 can be removed by photolithographic techniques, exposing portions of the trench hard mask 142 corresponding to the at least one trench 130 to be formed. Accordingly, the portions of the trench hard mask 142 corresponding to the at least one trench 130 can be removed, e.g., by etching. Thereafter, the photoresist can be removed and the at least one trench 130 can be formed, specifically, using the trench hard mask 142 as an etching mask.

According to embodiments, the at least one trench 130, specifically each of the trenches 130 if more than one trench 130 is formed, can have a bottom 130a and sidewalls 130b extending from the bottom 130a to the first side 101a of the semiconductor substrate 101. Further, the at least one trench 130, specifically each of the trenches 130 if more than one trench 130 is formed, can have a depth of equal to or more than 100 nm, specifically equal to or more than 200 nm, typically equal to or more than 350 nm, and/or equal to or less than 1500 nm, specifically equal to or less than 900 nm. Specifically, the depth of the trenches 130 can be less than the depth of the recesses 120.

After forming the at least one trench 130, the trench hard mask 142 can be removed. The at least one trench 130 can be checked for proper formation. For instance, measurements can be performed for determining the depth of the at least one trench. According to embodiments, a plurality of trenches 130 can be formed.

Figure 4B:
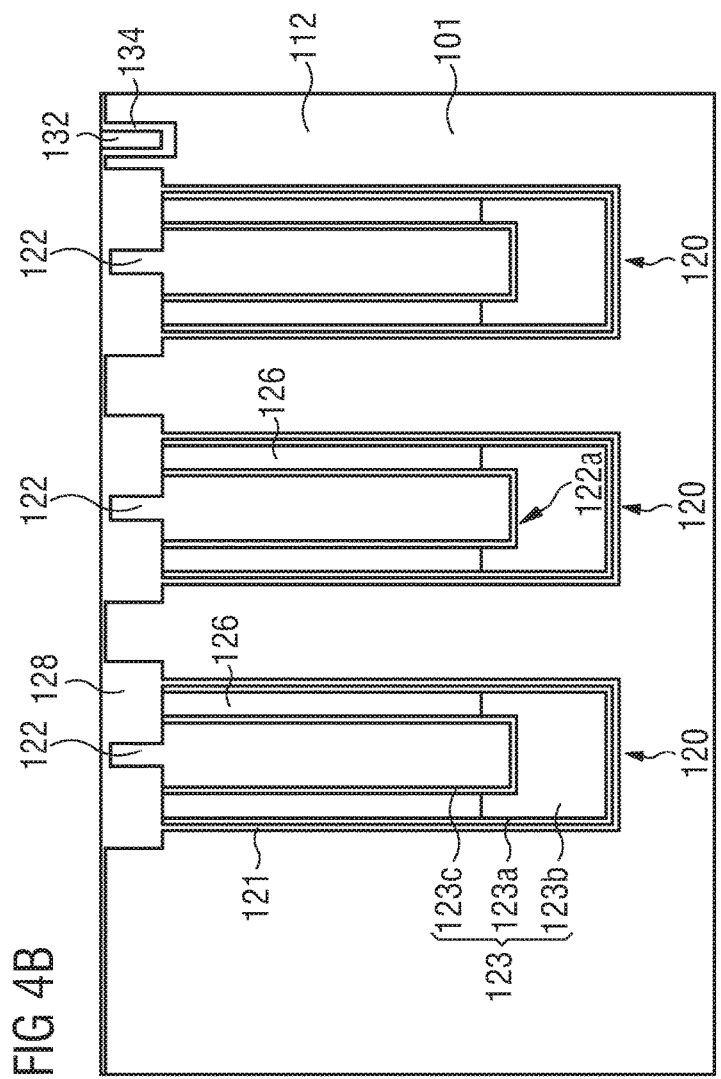

As shown in FIG. 4B, a gate dielectric 134 can be formed on the sidewalls 130b and the bottom 130a of the at least one trench 130 or the plurality of trenches 130 or trenches 130. For forming the gate dielectric 134, a gate dielectric material can be deposited on the substrate 101, specifically on the first side 101a of the substrate 101a, and/or in the trenches 130. Thereafter, the gate dielectric material can be removed from the first side 101a of the substrate 101, specifically in an area outside of the trenches 130, to a desired thickness, which can be zero or larger. The gate dielectric 134 can be formed to a thickness of equal to or more than 30 nm, specifically equal to or more than 40 nm, typically equal to or more than 50 nm, and/or equal to or less than 150 nm, specifically equal to or less than 100 nm, typically equal to or less than 90 nm. The gate dielectric material of the gate dielectric 134 can be an insulating material, such as an oxide or nitride. The gate dielectric 134 can also be formed by thermal oxidation.

Further, a gate electrode 132 is formed on the gate dielectric 134 in the trenches 130. The gate electrode 132 can be formed, e.g., by depositing gate electrode material being electrically conductive on the first side 101a of the substrate 101, filling the trenches 130. The gate electrode material can be removed from the first side 101a of the substrate 101, leaving gate electrode material in the trenches. The gate electrode 132 can be formed to a thickness of equal to or more than 300 nm, specifically equal to or more than 400 nm, typically equal to or more than 500 nm, and/or equal to or less than 800 nm, specifically equal to or less than 700 nm, typically equal to or less than 600 nm. The gate electrode material can be semiconductor material, such as poly-Si, amorphous silicon, refractory metal such as tungsten, tungsten silicide, or other metal silicide, titanium nitride, the same material as the filling structures 122, and/or combinations thereof.

Specifically, the gate dielectric 134 and the gate electrode 132 can fill the gate trenches 130. According to an embodiment, the gate dielectric 134 insulates the gate electrode 132 from the substrate 101. That is, the gate dielectric 134 can be disposed between the sidewalls 130b and the bottom 130a of the trenches 130 and the gate electrode 132.

According to an embodiment, the trenches 130 can be laterally spaced from the recesses 120. This is best shown in FIGS. 5A to 5D. Further, the trenches 130 can be formed to have a smallest lateral dimension which is less than a smallest lateral dimension of the recesses 120. Furthermore, the trenches 130 can be formed to have a largest lateral dimension which is less than a smallest lateral dimension of the recesses 120. In this context, a "lateral dimension" can be a dimension parallel to a plane of the first side 101a of the substrate 101.

A thermal treatment can be performed for annealing the gate electrode 132 and/or the gate dielectric 134. A CMP process can be performed for smoothing a surface of the substrate 101 having the gate dielectric material and/or the gate electrode material deposited thereon. For instance, the gate electrode material can be removed from the first side 101a of the substrate 101 by the CMP process to an extent so that an upper surface of the gate electrode material extending out from the trenches 130 is flush with an upper surface of a layer of gate dielectric material formed on the first side 100a of the substrate 101. Thereafter, a cleaning step can be performed.

The material of the gate dielectric 134 can be, specifically at least partially, typically totally, removed from the first side 101a of the substrate 101. The material of the gate dielectric 134 can be removed from the first side 101a of the substrate, e.g., by a plasma etch process. Next, a thin amorphous material, such as an oxide, can be deposited on the first side 101a of the substrate 101, to act as an implant scattering layer.

According to embodiments, at least one doping region 114 can be formed in the semiconductor substrate 101. For instance, a plurality of doping regions 114 can be formed. Specifically, the doping regions 114 can be respectively formed between the plurality of trenches 130 and the plurality of recesses 122 and/or between the plurality of recesses 120, where there is no trench 130 formed between adjacent recesses 120.

The doping region 114 can include a body region 114a. Specifically, a dopant can be implanted into the drift region to form a doping region 114a having a conductivity type opposite to the conductivity type of the drift region. For instance, when the substrate 101 is an n-type semiconductor, the doping region 114a can be doped with a p-type dopant, and vice versa. Doping of the doping region 114a can lead to a change of a semiconductor conductivity type, e.g, from n-type to p-type, and vice versa. According to embodiments, the dopant, specifically for the implantation of the body regions 114a, can be Boron (B), which can be implanted at 60 keV to a concentration of 1.6 E13/cm$^2$, Thereafter, the photoresist can be removed and/or a thermal treatment can be performed. For instance, the semiconductor device 100 can be subjected to a thermal treatment of about 1000° C. for about 60 min (Body Drive).

Further, the doping region can include a source region 114b as shown in FIG. 4C. The source region 114b can be formed in at least some regions in which the body regions 114a were formed. For instance, the source region 114b can be respectively formed between the plurality of trenches 130 and the plurality of recesses 122 and/or not between the plurality of recesses 120, where there is no trench 130 formed between adjacent recesses 120. For forming the source region 114b, a further patterning process by lithographic methods including a photoresist and pattering the photoresist can be performed. According to embodiments, the dopant for the implantation of the body regions 114a can be Arsenic (As), which can be implanted at 30 keV to a concentration of 3 E15/cm$^2$. According to embodiments, the absolute dopant concentration of the source region 114b can be higher than the dopant concentration in the body region 114a. Thereafter, the photoresist can be removed and/or a thermal treatment can be performed.

FIG. 4D shows exemplarily body implantation and source implantation. Typically, first p-dopants are implanted to form body regions 114a followed by implantation of n-dopants to form source regions 114b embedded into the body regions 114a.

As shown in FIG. 4D, an insulating layer 116 or insulating stack 116 can be formed on the first side 101a of the first substrate 101. Specifically, the insulating stack 116 can include one or more insulating layers that can be deposited one after another. For instance, the insulating layer 116 can include a first layer, e.g., of SiON, a second layer, e.g. of SiOx, and a third layer, e.g. of BPSG. The first layer can be formed or deposited to a thickness of equal to or more than 20 nm and/or equal to or less than 40 nm, typically equal to about 30 nm. The second layer can be formed or deposited to a thickness of equal to or more than 150 nm and/or equal to or less than 250 nm, typically equal to about 200 nm. The third layer can be formed or deposited to a thickness of equal to or more than 1000 nm and/or equal to or less than 1500 nm, typically equal to about 1275 nm. Thereafter, a thermal treatment can be performed. For instance, the semiconductor device 100 can be subjected to a thermal treatment of about 950° C. for about 40 min (Source Drive).

Figure 7A:
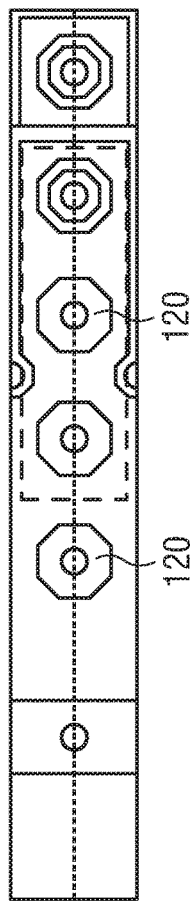
FIG. 7A illustrates the processes of FIG. 6A in a top view onto the semiconductor substrate.
Figure 6A:
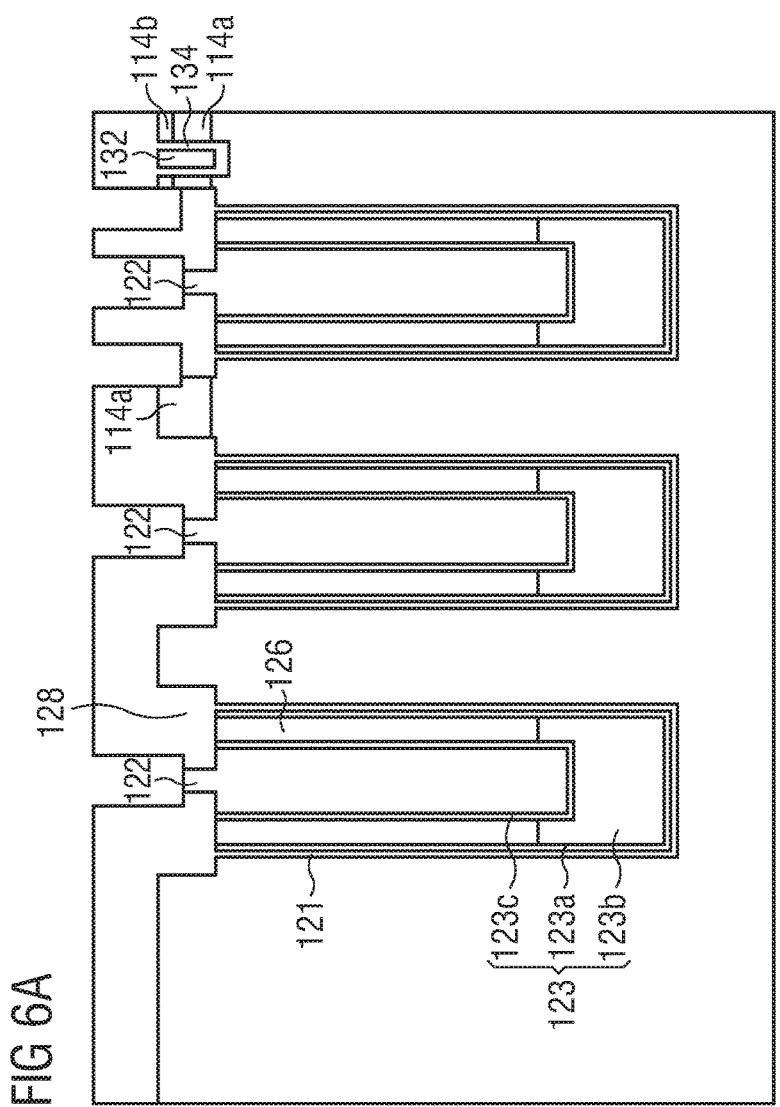

As shown in FIGS. 6A and 7A, the insulating stack 116 can be patterned by lithographic methods to at least partially expose the filling structures 122 and/or respective regions between the trenches 130 and the recesses 120. As shown in FIGS. 6A and 7A, the regions to be exposed between the trenches 130 and recesses 120 can be such that at least a region of the doping region 114 can be exposed. Specifically, as seen in the top view of FIG. 7A, the regions to be exposed between the trenches 130 and the recesses 120 can be in the form of a ring surrounding the filling structures 122. For instance, a photoresist can be applied and patterned so that regions of the photoresist corresponding to the regions to be exposed are removed. The insulating stack 116 can be etched in the regions where the photoresist is removed, specifically down to the filling structures 122 and/or the first side 101a of the substrate 101, respectively. In that context, the filling structures 122 and/or the substrate 101 can provide an etch stop. After etching of the insulating stack 116, the photoresist can be removed.

Using the etched regions of the insulating stack 116 as a pattern, the filling structures 122 and the substrate 101 can be etched in the exposed regions. Specifically, doping regions 114a, 114b of the substrate 101 can be etched from the first side 101a down through the source region 114b to expose the body region 114a. Further, a part of the body region 114a can be removed. Thereafter, depth & CD measurements can be performed.

FIG. 7A shows the top view indicating the location of the etched regions. As further shown in FIGS. 6A and 7A, the source regions 114b are only formed in the active area of the device while body regions 114a are formed in both the active area and a transition area to the edge termination area which extends to the left of FIG. 7A.

FIG. 6B shows forming of a source metallization 142.

Having regions of the body region 114a exposed and/or partially etched, a body contact implantation can be performed to increase the p-type dopants in a contact area for the source metallization 114 to be formed. For instance, BF$_2$ at 15 keV can be used to implant p-type dopants to a concentration of 1E 15/cm$^2$, Thereafter, an annealing process can be performed, e.g. at 975° C. for 30 s. When practicing embodiments, a contact resistance between the doping region and the source metallization can be formed.

For forming the source metallization 142, TiTiN (titanium-titanium nitride) can be sputtered. A TiSi (titanium silicide) layer can be formed under the TiTiN-layer. A W-layer (tungsten layer) can be formed on the TiN-layer. For instance, the W-layer can be formed to have a thickness of equal to or more than 400 nm and/or equal to or less than 600 nm, typically equal to about 500 nm. Thereafter, the W-layer can patterned by lithographic methods and/or the W-layer and the TiTiN-layer can be plasma etched. After pattering, the source metallization 142 can be completed. Specifically, the source metallization 142 can contact the filling structures 122 and the doping regions 114a, 114b. According to embodiments, an electrical connection between the body regions 114a and/or the source regions 114b and at least some of the filling structures 122 in the recesses 120 can be formed.

The source metallization 142 is in ohmic contact with the source regions 114b and body regions 114a in the active area, with the body regions 114a in the transition area, and with the filling structures 122 formed in both the transition and active area. The filling structures 122 form respective field electrodes that facilitate depletion of the drift region in mesa regions between adjacent recesses 120 in blocking mode of the device.

As shown in FIG. 6C, an AlCu (Aluminum-Copper) layer 144 can be deposited. Specifically, the AlCu layer 144 can be sputtered on the first side 101a of the substrate 101 and/or over the source metallization 142. For instance, the AlCu layer 144 can be formed to have a thickness of equal to or more than 3 μm and/or equal to or less than 9 μm, typically equal to about 5 μm. The AlCu layer 144 can be patterned and etched by photolithographic methods. Next, a Si3N4 (Silicon nitride) layer 146 can be deposited. Specifically, the Si3N4 layer 146 can be formed on the first side 101a of the substrate 101 and/or over the source metallization 142 and/or over the AlCu layer 144. For instance, the Si3N4 layer 146 can be formed to have a thickness of equal to or more than 20 nm and/or equal to or less than 60 nm, typically equal to about 40 nm. The AlCu layer 144 can be patterned and etched by photolithographic methods However not shown, a gate metallization can be formed for providing an electrically connection to and/or between the gate electrodes 134 in the plurality of trenches 130. Specifically, the gate metallization can be formed beside or under the source metallization having an insulating layer disposed in-between and/or openings can be formed in the source metallization to at least partially expose the gate electrodes 134.

In view of the above, a method for manufacturing a semiconductor device is provided according to an embodiment. The method includes: forming a field electrode needle trench in the semiconductor substrate; forming a field electrode insulating device in the field electrode needle trench by depositing a field electrode insulating material in the field electrode needle trench; forming a field electrode in the field electrode needle trench; and removing at least partially the field electrode insulating material from the field electrode needle trench to form at least one cavity in the field electrode insulating device.

According to embodiments, a method for manufacturing a semiconductor device includes: providing a semiconductor substrate having a first side; forming at least one recess in the semiconductor substrate, the at least one recess having a bottom and a sidewall extending from the bottom to the first side of the semiconductor substrate; forming an auxiliary structure on the sidewall and the bottom of each of the recesses and forming a hollow space within each of the recesses; filling the hollow space of the at least one recess with a filling material for forming a filling structure in the at least one recess; removing portions of the auxiliary structure from the sidewall of the at least one recess to form cavities between the filling structure and the sidewall of the recess; and sealing the cavity at the first side of the semiconductor substrate.

According to embodiments, a method for manufacturing a semiconductor device includes: providing a semiconductor substrate having a first side; forming a plurality of recesses in the semiconductor substrate, each of the recesses having a bottom and a sidewall extending from the bottom to the first side of the semiconductor substrate; forming an insulation structure on the sidewall and the bottom of each of the recesses and forming a hollow space within each of the recesses; filling the hollow space of the respective recesses with an electrically conductive material for forming respective electrically conducting structures in the recesses, each of the electrically conducting structures having a lower end opposite the bottom of the respective recess; removing portions of the insulation structure from the sidewall of the respective recesses to form cavities between the electrically conducting structures and the sidewall of the recesses; and sealing the cavities at the first side of the semiconductor substrate.

According to an embodiment, a method for manufacturing a semiconductor device includes: providing a semiconductor substrate 101; forming at least one recess 120 in the semiconductor substrate 101, the recess 120 having a bottom 120a and a sidewall 120b; forming an auxiliary structure 123 on the sidewall 120b and the bottom 120a of the recess 120 and forming a hollow space 125 within the recess 120; filling the hollow space 125 of the recess 120 with a filling material for forming a filling structure 122 in the recess 120; removing portions of the auxiliary structure 123 from the sidewall 120b of the recess 120 to form at least one cavity 126 between the filling structure 122 and the sidewall 120b of the recess 120; and sealing the cavity 126 at the first side 101a of the semiconductor substrate 101.

According to an embodiment, a power semiconductor device 100 includes a semiconductor substrate 101 having a drift region 112. The power semiconductor device 100 further includes a trench 130 or gate electrode trench 130 in the semiconductor substrate 101, extending into the drift region 112 and including a gate electrode 132. The gate electrode 132 is arranged in the gate electrode trench 130 and is electrically insulated from the drift region 112 by a gate dielectric layer 134 arranged between the gate electrode 132 and the drift region 112. Further, the power semiconductor device includes a recess 120 or field electrode needle trench 120 in the semiconductor substrate 101, laterally spaced from the gate electrode trench 130 and extending into the drift region 112. The field electrode needle trench 120 includes an electrically conducting structure 122 or field electrode 122 arranged in the field electrode needle trench 120 and electrically insulated from the drift region 112 by a cavity 126 formed between the field electrode 122 and the drift region 112.

Figure 8A:
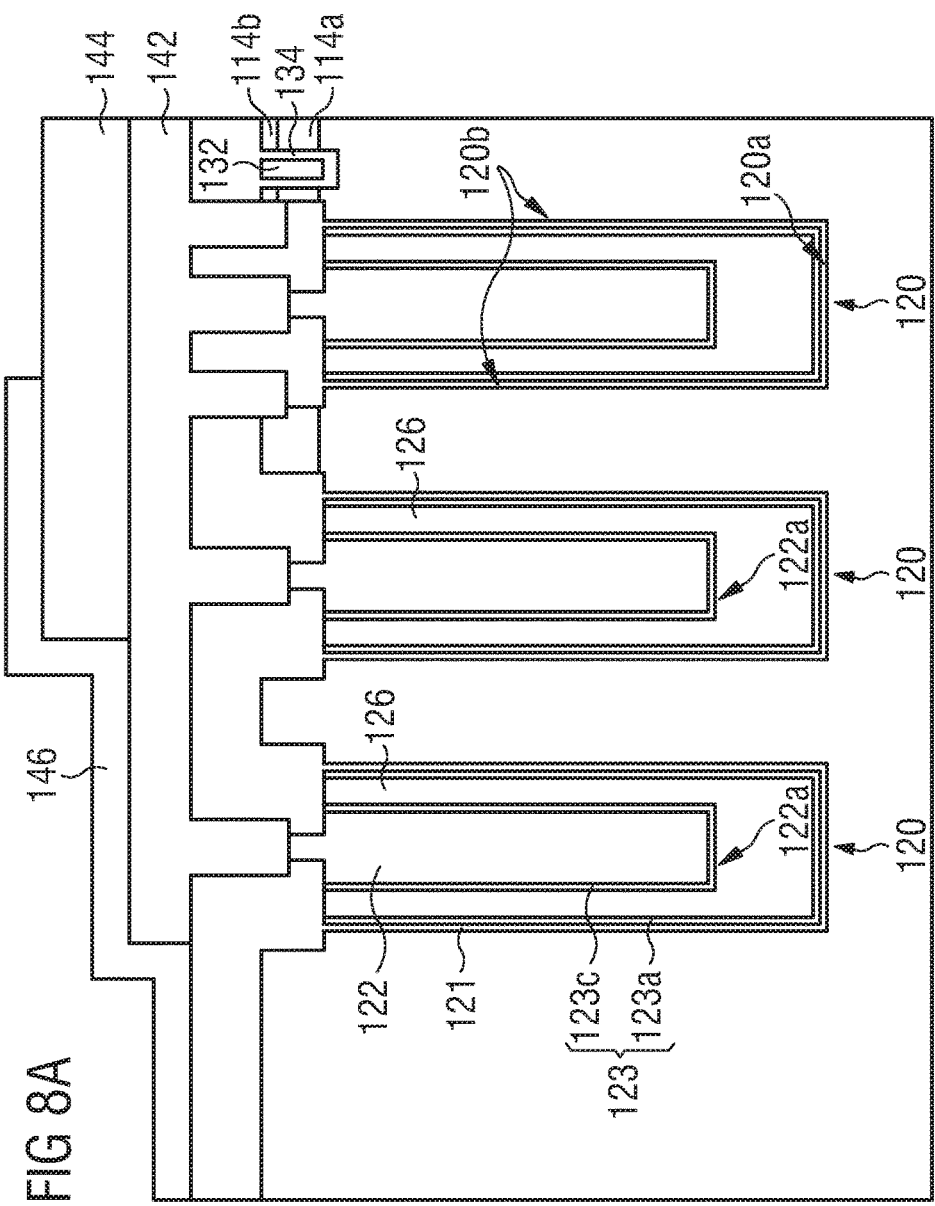

According to embodiments exemplary shown in FIG. 8A, portions of the auxiliary structure 123 between the lower end 122a of the filling 122 and the bottom 120a of the recesses 120 in a lower portion of the recesses 120 can be removed for forming the cavities 126 between the filling structures 122 and the sidewall 120b of the recesses 120. For instance, the second auxiliary layer 123b can be removed from the recesses 120. Specifically, the second auxiliary layer 123b can be totally removed from the recesses 120. In this context, "totally removed" can be understood as removing a material, such as the second auxiliary material, totally within the limits of the used process. For instance, some residual material can be left when removing material totally. However, such occurrence of residual material can still be understood as having the material "totally removed".

FIG. 8B shows removing of the auxiliary structure 123 further to the bottom 120a of the recesses 120. According to embodiments, the auxiliary structure 123, specifically the second auxiliary layer 123b can be removed from the sidewall 120b of the recesses 120 in the area between the lower end 122a of the filling structures 122 and the bottom 120a of the recesses 120 to such an extent that a length along which the auxiliary structure 123, specifically, the second auxiliary layer 123b, is removed is larger than a length along which the auxiliary structure 123, specifically, the second auxiliary layer 123b, is not removed. As outlined above, the auxiliary structure 123, specifically the second auxiliary layer 123b can be anisotropically etched in the area between the lower end 122a of the filling structures 122 and the bottom 120a of the recesses 120. When practicing embodiments, the anisotropic etch can enable a removal of the second auxiliary material 123b from the sidewalls 120b of the recesses 120 while leaving the second auxiliary layer 123b at the bottom 120a of the recesses 120. Specifically, the second auxiliary material 123b can be left at the bottom 120a of the recesses 120 with the thickness t2, spanning the full gap between the bottom 120a of the recesses 120 and the lower end 122a of the filling structure 122.

As outlined above, in view of the electric properties of the auxiliary structure 123 it can be beneficial to etch the second auxiliary layer 123a to the bottom 120a of the recesses 120 as possible. However, in view of the anchoring effect provided by the auxiliary structure 123, in particular by the second auxiliary layer 123b, for holding the filling structure 122 it can be beneficial to leave as much material of the second auxiliary layer 123a as possible. Accordingly, for structures being fragile and tend to brake, more material of the second auxiliary layer 123a can be left while for structures in which the dielectric properties are more important, more material can be removed below the lower end 122 of the filling structures 122.

According to an embodiment, the third auxiliary layer 123c, or the third insulating layer 123c, can partially or completely cover the outer surface of the electrically conducting structures 122 or field electrode 122 facing to the cavity. The outer surface of the electrically conducting structures 122 is therefore not exposed to the cavity but remains covered by the third auxiliary layer 123c.

According to an embodiment, the first auxiliary layer 123a, or the first insulating layer 123a, can partially or completely cover portions of the sidewalls 120b and the bottom 120a of the recess 120. The cavity 126 can thus laterally be surrounded by material of the first auxiliary layer 123a and of the third auxiliary layer 123c.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method for manufacturing a semiconductor device, the method comprising:
   providing a semiconductor substrate having a first side;
   forming at least one recess in the semiconductor substrate, the at east one recess having a bottom and a sidewall extending from the bottom to the first side of the semiconductor substrate;
   forming an auxiliary structure on the sidewall and the bottom of the at least one recess and forming a hollow space within the at least one recess;
   filling the hollow space of the at least one recess with a filling material for forming a filling structure in the at least one recess;
   removing portions of the auxiliary structure from the sidewall of the at least one recess so as to form at least one cavity between the filling structure and the sidewall of the at least one recess; and
   sealing the at least one cavity at the first side of the semiconductor substrate.

2. The method of claim 1, wherein the auxiliary structure has a first thickness t1 at the bottom of the at least one recess and a second thickness t2 at the sidewall, wherein the first thickness t1 is at least 2-times larger than the second thickness t2.

3. The method of claim 1, further comprising:
   recessing the auxiliary structure from the first side of the semiconductor substrate prior to removing portions of the auxiliary structure so as to expose the filling structure in an upper portion of the at least one recess which is spaced from a lower portion of the at least one recess; and
   wherein sealing the at least one cavity comprises forming an insulating plug in the upper portion of the at least one recess after partially removing the auxiliary structure.

4. The method of claim 1, wherein forming the auxiliary structure comprises:
   conformally depositing a first auxiliary material on the sidewall of the at least one recess so as to form a first auxiliary layer;
   depositing a second auxiliary material on the first auxiliary layer so as to form a second auxiliary layer, the second auxiliary material being selectively etchable with respect to the first auxiliary material; and
   conformally depositing a third auxiliary material on the second auxiliary layer so as to form a third auxiliary layer.

5. The method of claim 4, wherein the second auxiliary material is deposited by CVD (chemical vapour deposition), HDP CVD (high-density plasma chemical vapour deposition), TEOS (Tetraethyl Orthosilicate) deposition, or PSG (phosphosilicate glass) deposition.

6. The method of claim 4, wherein the first auxiliary material and the third auxiliary material are a material that is impervious to oxygen diffusion.

7. The method of claim 6, wherein the first auxiliary material and the third auxiliary material are silicon nitride and the first auxiliary layer and the third auxiliary layer are silicon nitride layers.

8. The method of claim 4, wherein removing portions of the auxiliary structure comprises:
   etching the second auxiliary material selectively to the first and the third auxiliary materials to partially remove the second auxiliary layer from the first auxiliary layer and the third auxiliary layer down to the lower portion of the at least one recess.

9. The method of claim 8, wherein the second auxiliary material is etched to have upper surface portions which are arranged below a lower end of the filling structure.

10. The method of claim 4, wherein the auxiliary structure is recessed from the first side of the semiconductor substrate by:
recessing the first auxiliary layer and the third auxiliary layer in a common process; and
recessing the second auxiliary layer in a further process separate to the common process.

11. The method of claim 1, wherein the at least one recess has an aspect ratio of depth to smallest lateral extension of at least 2:1.

12. The method of claim 1, further comprising:
forming a doping region in the semiconductor substrate; and
forming an electrical connection between the doping region and the filling structure in the at least one recess.

13. The method of claim 1, further comprising:
forming at least one trench in the semiconductor substrate, the at least one trench having a bottom and sidewalls extending from the bottom to the first side of the semiconductor substrate, the at least one trench having a depth which is less than a depth of the at least one recess;
forming a gate dielectric on the sidewalls and the bottom of the at least one trench; and
forming a gate electrode on the gate dielectric in the at least one trench.

14. The method of claim 13, wherein the at least one trench is laterally spaced from the at least one recess, and wherein the at least one trench is formed to have a smallest lateral dimension which is less than a smallest lateral dimension of the at least one recess.

15. The method of claim 1, wherein removing portions of the auxiliary structure from the sidewall of the at least one recess comprises leaving portions of the auxiliary structure between a lower end of the filling structure and the bottom of the at least one recess in a lower portion of the at least one recess so as to provide a structural connection between the lower end of the filling structure and the bottom of the at least one recess.

* * * * *